US 8,581,424 B2

(12) United States Patent
Hirai et al.

(10) Patent No.: US 8,581,424 B2
(45) Date of Patent: Nov. 12, 2013

(54) INFORMATION RECORDING/REPRODUCING DEVICE

(75) Inventors: Takahiro Hirai, Yokohama (JP); Tsukasa Nakai, Hino (JP); Kohichi Kubo, Yokohama (JP); Chikayoshi Kamata, Kawasaki (JP); Takayuki Tsukamoto, Kawasaki (JP); Shinya Aoki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 62 days.

(21) Appl. No.: 13/228,938

(22) Filed: Sep. 9, 2011

(65) Prior Publication Data

US 2012/0061732 A1 Mar. 15, 2012

Related U.S. Application Data

(63) Continuation of application No. PCT/JP2009/054462, filed on Mar. 9, 2009.

(51) Int. Cl.
*H01L 23/544* (2006.01)
*H01L 23/52* (2006.01)
*H01L 29/06* (2006.01)
*H01L 47/00* (2006.01)
*H01L 21/82* (2006.01)

(52) U.S. Cl.
USPC ............... 257/797; 257/211; 257/5; 438/129; 438/130

(58) Field of Classification Search
USPC .......... 257/1–8, 202–211; 438/128–132, 400, 438/401, 618–657; 365/148, 72, 151
See application file for complete search history.

(56) References Cited

U.S. PATENT DOCUMENTS

| 5,471,363 | A | 11/1995 | Mihara |
| 6,261,883 | B1 | 7/2001 | Koubuchi et al. |
| 7,733,684 | B2 | 6/2010 | Kubo et al. |
| 7,936,587 | B2 | 5/2011 | Kubo et al. |
| 8,018,762 | B2 | 9/2011 | Kubo et al. |
| 2001/0022399 | A1* | 9/2001 | Koubuchi et al. ............. 257/758 |

(Continued)

FOREIGN PATENT DOCUMENTS

| JP | 7-93969 | 4/1995 |
| JP | 9-162372 | 6/1997 |

(Continued)

OTHER PUBLICATIONS

Japanese Office Action Issued Feb. 5, 2013 in Patent Application No. 2011-503586 (with English translation).

(Continued)

*Primary Examiner* — Fernando L Toledo
*Assistant Examiner* — Karen Kusumakar
(74) *Attorney, Agent, or Firm* — Oblon, Spivak, McClelland, Maier & Neustadt, L.L.P.

(57) ABSTRACT

According to one embodiment, an information recording/reproducing device including a semiconductor substrate, a first interconnect layer on the semiconductor substrate, a first memory cell array layer on the first interconnect layer, and a second interconnect layer on the first memory cell array layer. The first memory cell array layer comprises an insulating layer having an alignment mark, and a stacked layer structure on the insulating layer and including a storage layer and an electrode layer. All of the layers in the stacked layer structure comprises a material with a permeability of visible light of 1% or more.

16 Claims, 22 Drawing Sheets

(56) References Cited

U.S. PATENT DOCUMENTS

| | | | |
|---|---|---|---|
| 2002/0074611 A1 | 6/2002 | Koubuchi et al. | |
| 2002/0079520 A1 | 6/2002 | Nishihara et al. | |
| 2003/0119212 A1 | 6/2003 | Nishihara et al. | |
| 2004/0012093 A1 | 1/2004 | Koubuchi et al. | |
| 2004/0159828 A1* | 8/2004 | Rinerson et al. | 257/2 |
| 2005/0026405 A1 | 2/2005 | Koubuchi et al. | |
| 2005/0040537 A1 | 2/2005 | Koubuchi et al. | |
| 2005/0040538 A1 | 2/2005 | Koubuchi et al. | |
| 2005/0179110 A1 | 8/2005 | Koubuchi et al. | |
| 2005/0211995 A1* | 9/2005 | Ou et al. | 257/80 |
| 2006/0222962 A1* | 10/2006 | Chen et al. | 430/5 |
| 2006/0250836 A1* | 11/2006 | Herner et al. | 365/148 |
| 2007/0222001 A1 | 9/2007 | Koubuchi et al. | |
| 2008/0017990 A1 | 1/2008 | Koubuchi et al. | |
| 2008/0036091 A1 | 2/2008 | Koubuchi et al. | |
| 2008/0173973 A1 | 7/2008 | Koubuchi et al. | |
| 2011/0170333 A1 | 7/2011 | Kubo et al. | |
| 2011/0216576 A1 | 9/2011 | Aoki et al. | |

FOREIGN PATENT DOCUMENTS

| | | |
|---|---|---|
| JP | 10-335333 | 12/1998 |
| JP | 10-335333 A | 12/1998 |
| JP | 2002-197857 | 7/2002 |
| JP | 2002-197857 A | 7/2002 |
| JP | 2007-99618 | 4/2007 |
| JP | 2007-134603 | 5/2007 |
| JP | 2007-335471 | 12/2007 |
| JP | 2008-537642 A | 9/2008 |

OTHER PUBLICATIONS

International Search Report mailed Jun. 9, 2009 in PCT/JP2009/054462 filed Mar. 9, 2009 (with English Translation).

Japanese Written Report mailed Jun. 9, 2009 in PCT/JP2009/054462 filed Mar. 9, 2009.

* cited by examiner

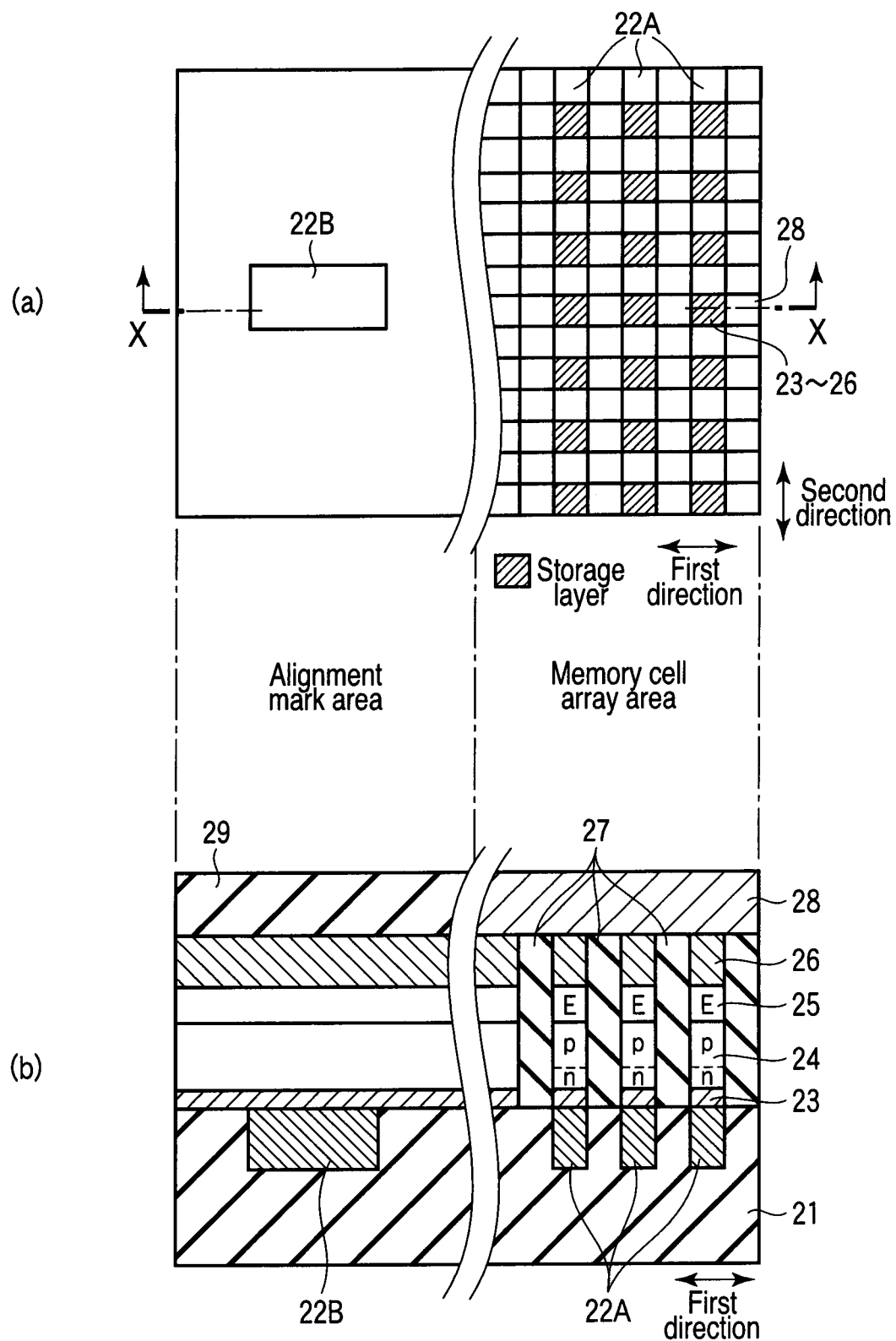
F I G. 3

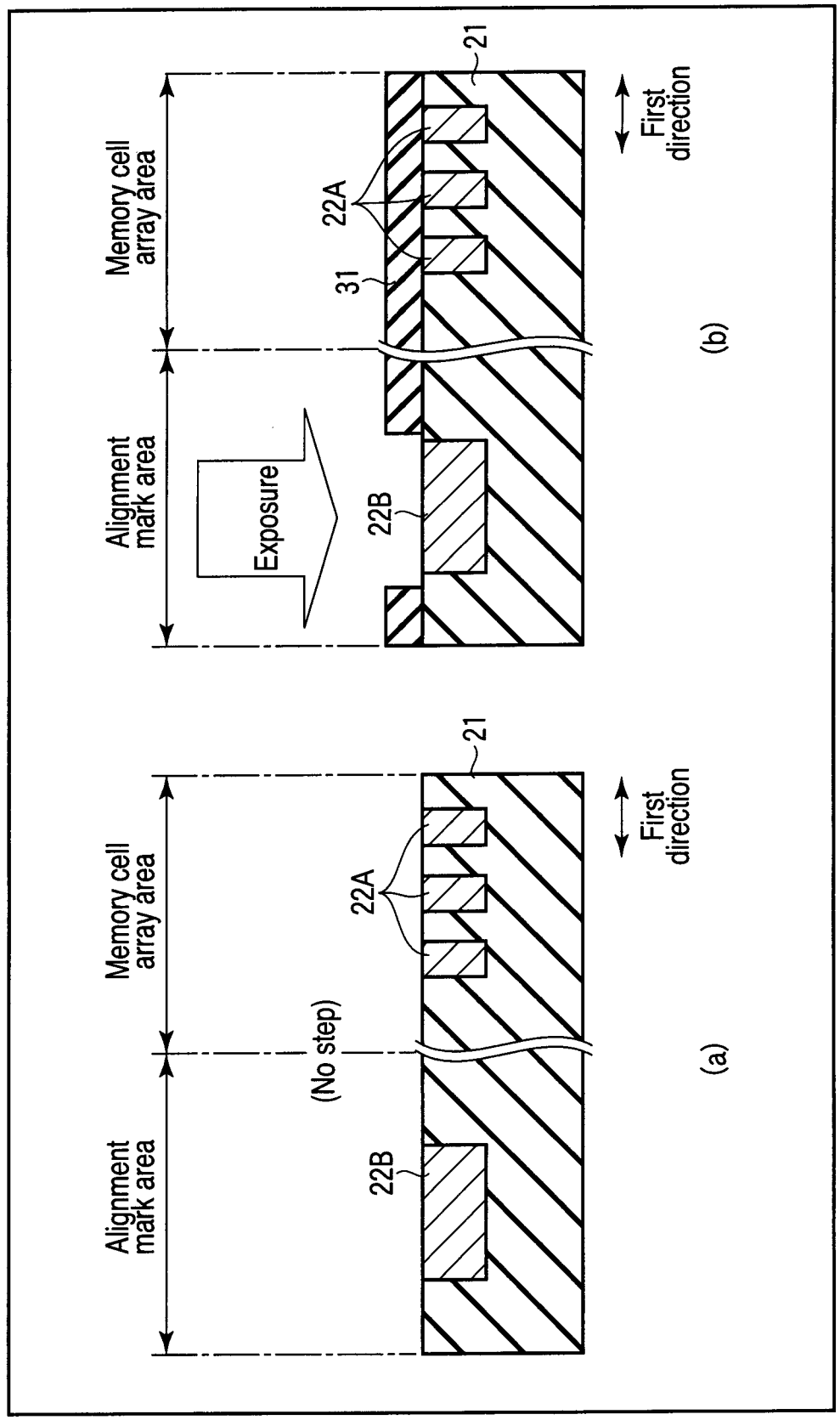
F I G. 9

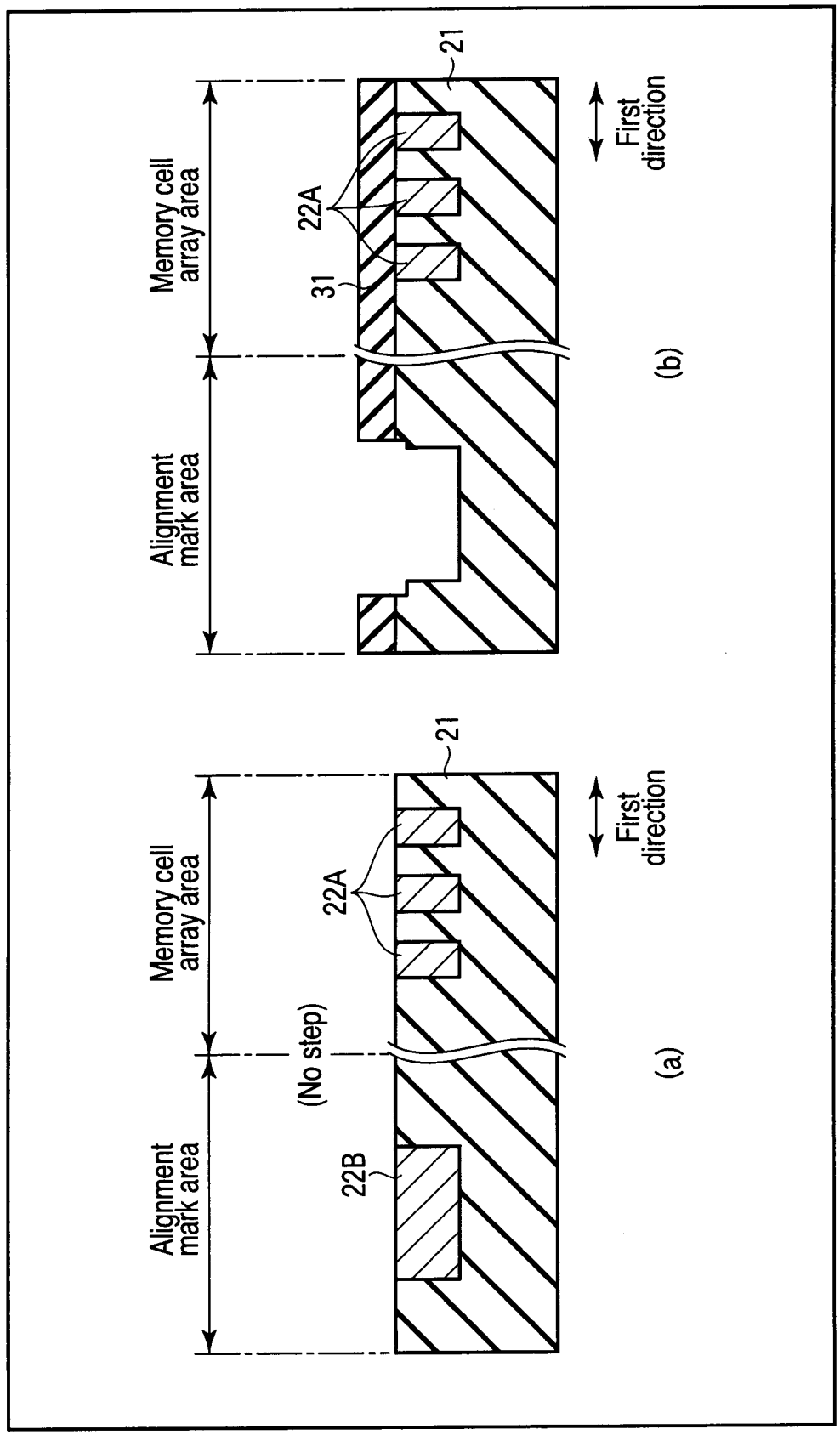
F I G. 10

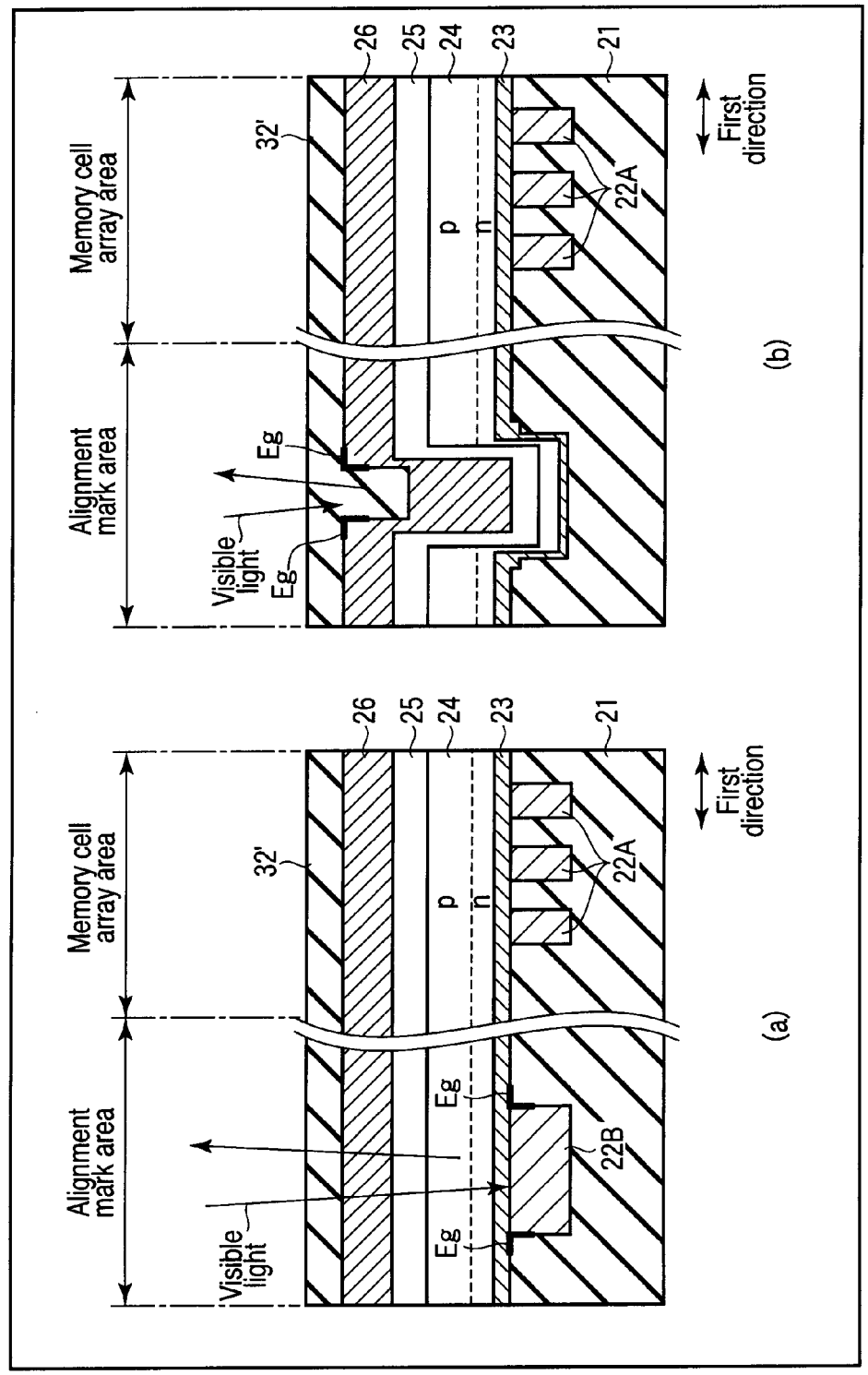
F I G. 11

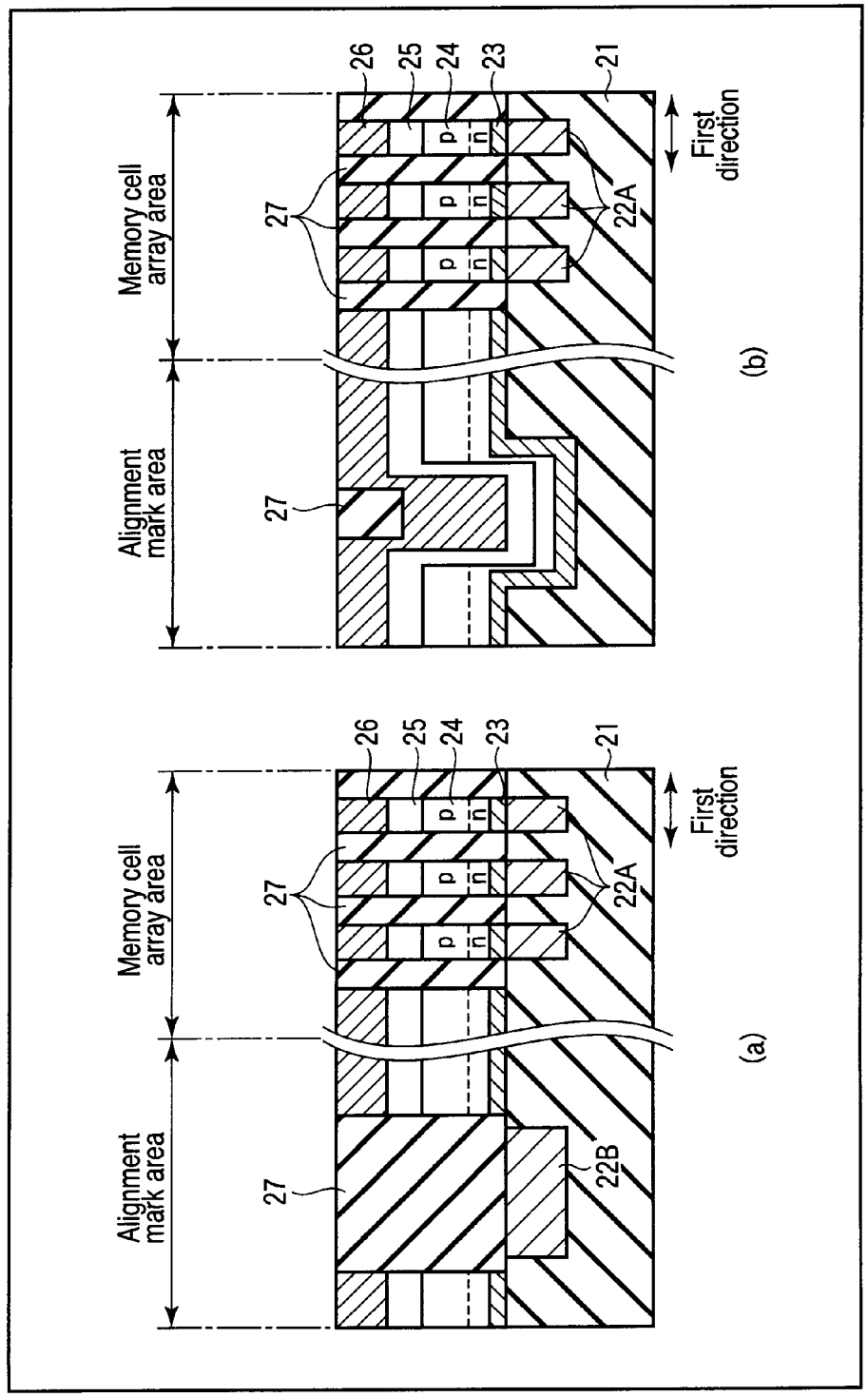
F I G. 14

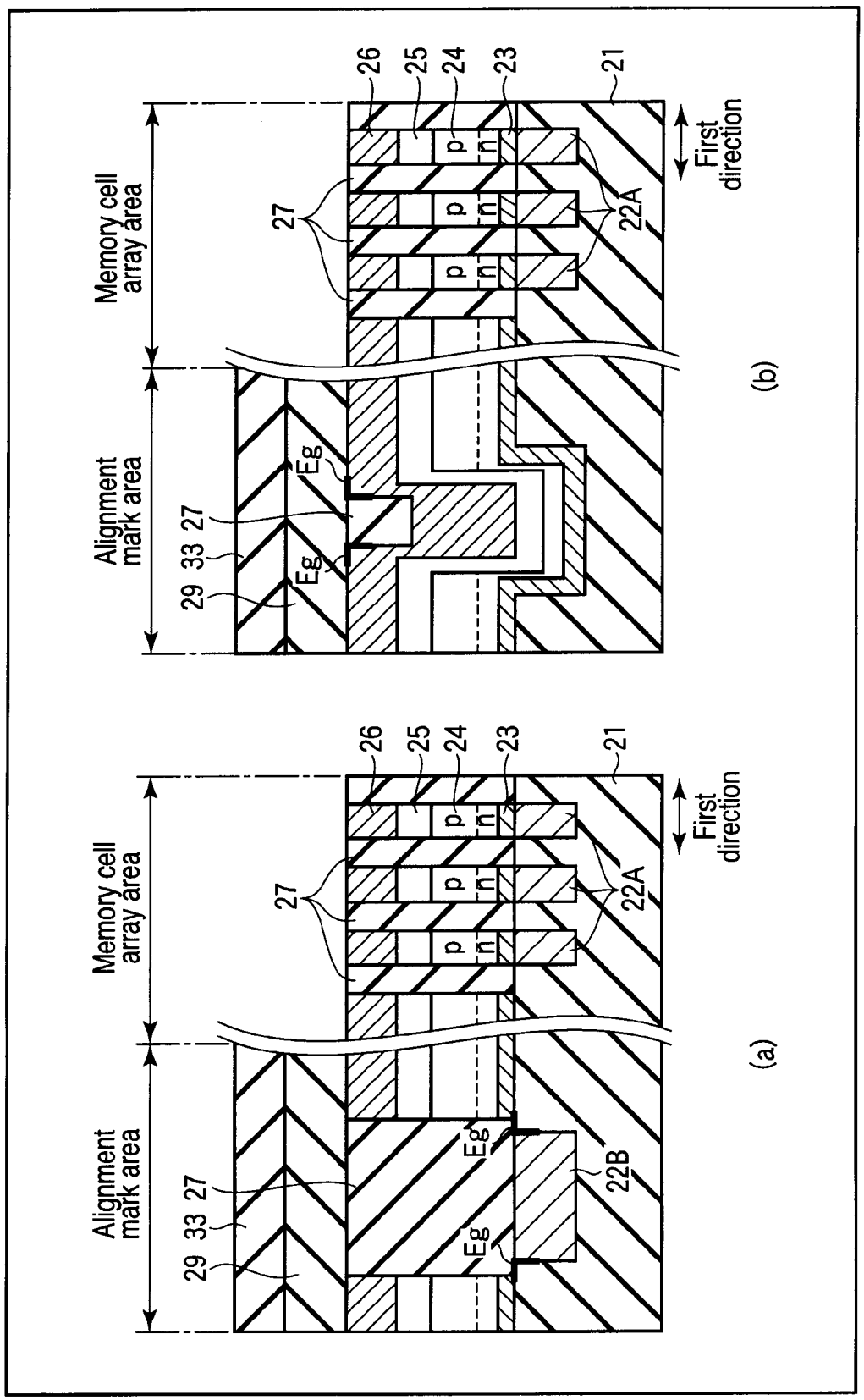
F I G. 15

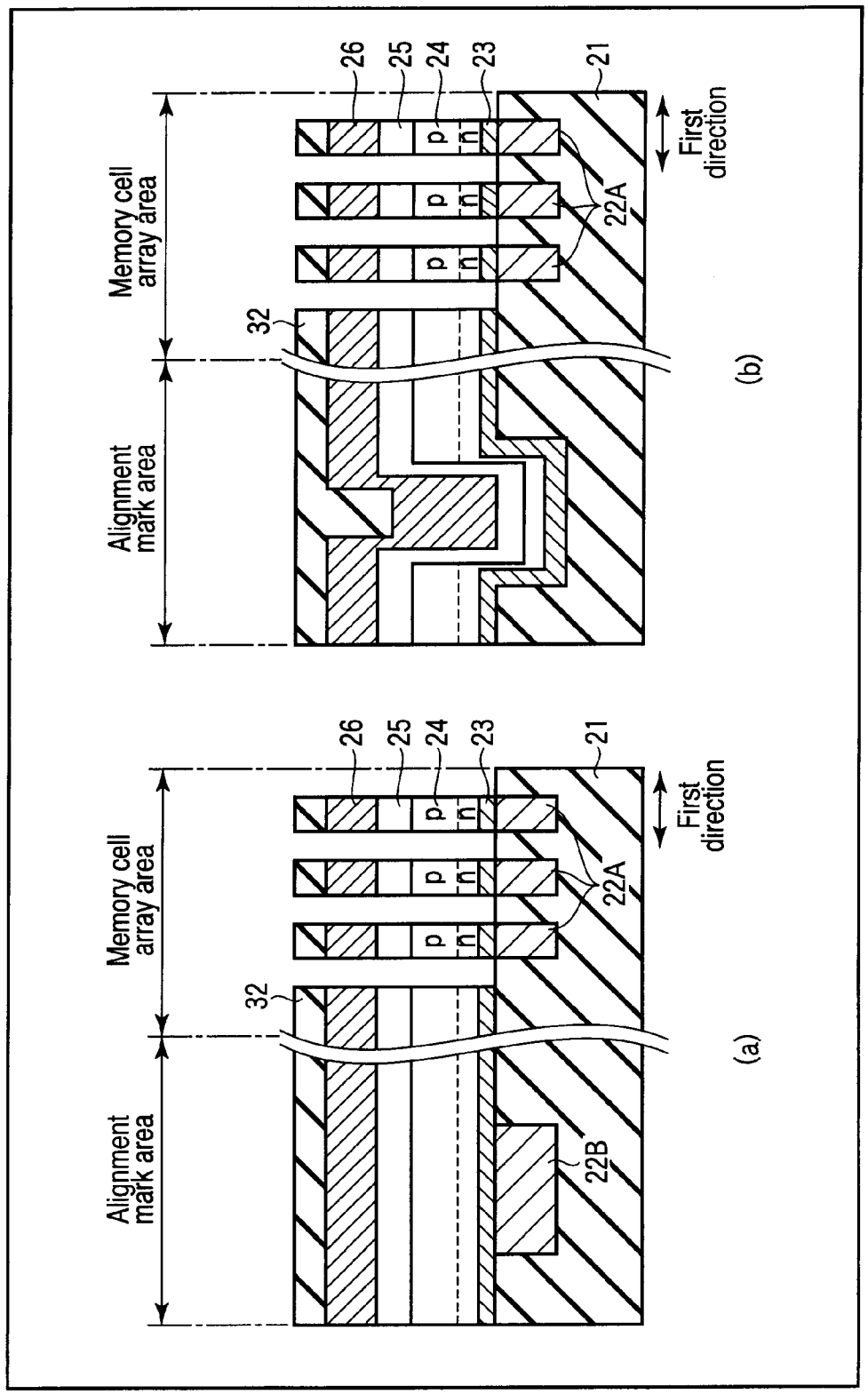
F I G. 19

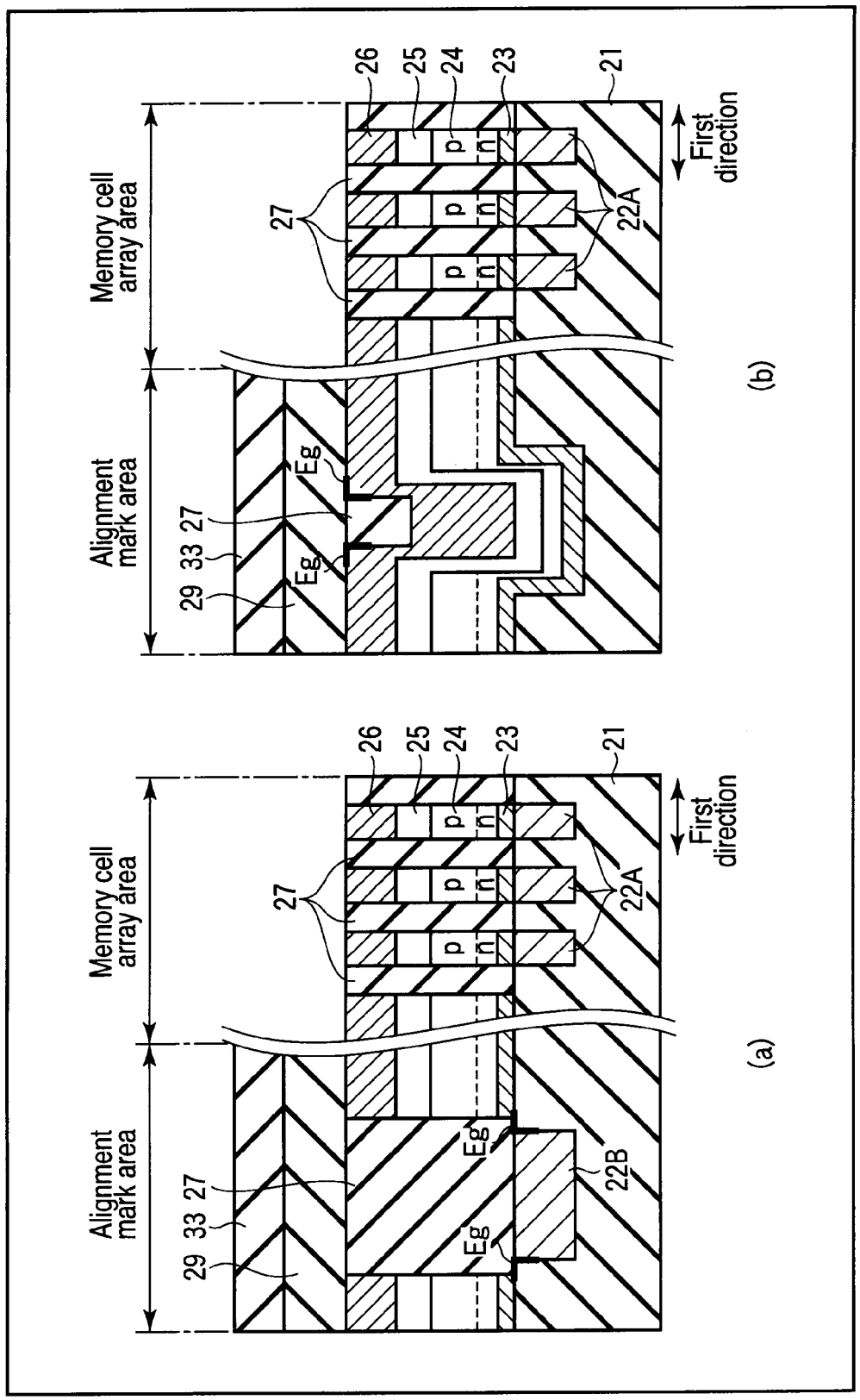
F I G. 21

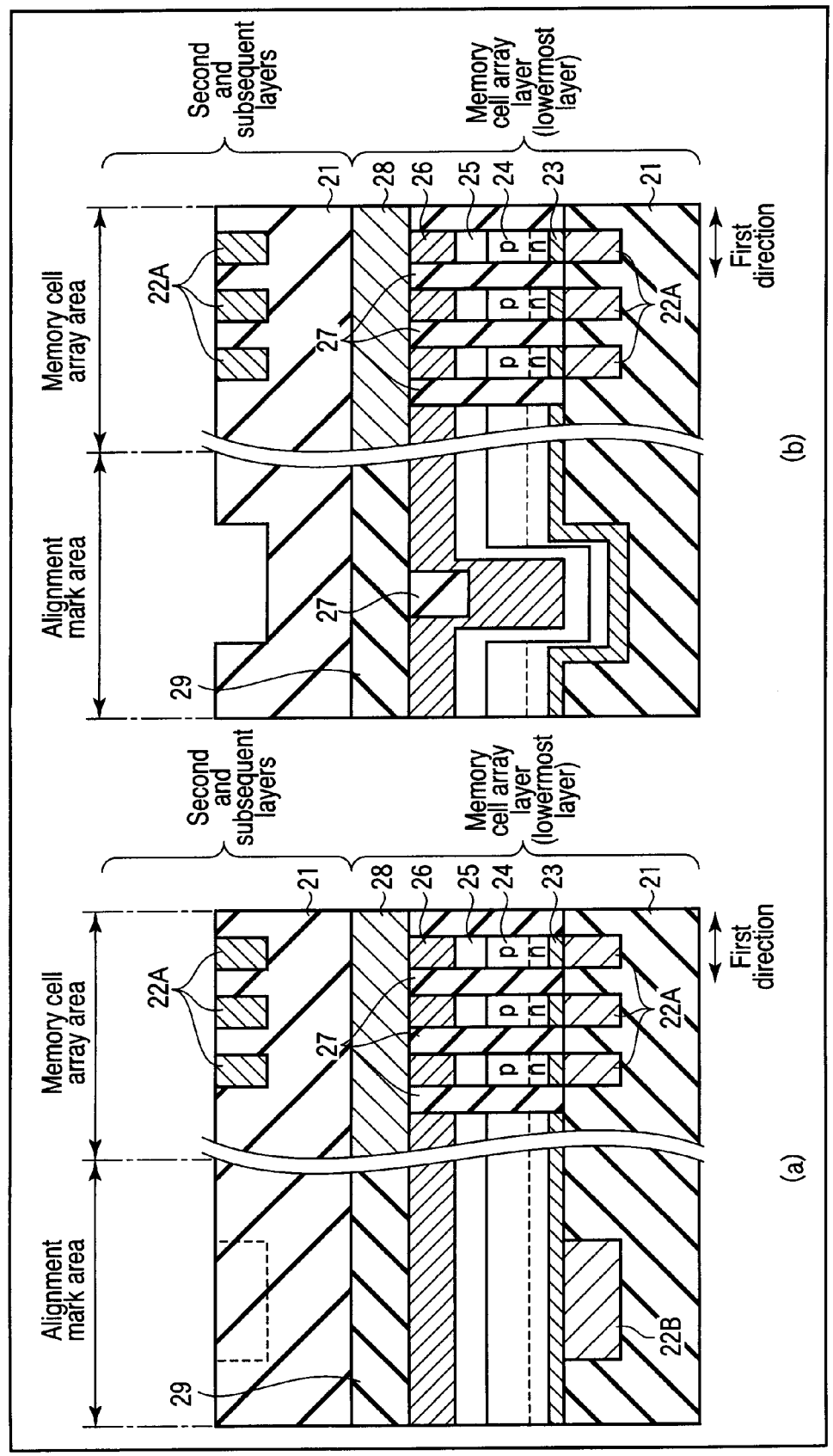
F I G. 23

INFORMATION RECORDING/REPRODUCING DEVICE

CROSS REFERENCE TO RELATED APPLICATION

This application is a Continuation Application of PCT Application No. PCT/JP2009/054462, filed Mar. 9, 2009, the entire contents of which are incorporated herein by reference.

FIELD

Embodiments described herein relate generally to an information recording/reproducing device.

BACKGROUND

In recent years, a resistance-change memory aiming to significantly exceed the limit on the bit density is being proposed.

For example, considerations are given to using a ternary oxide including a transition metal element such as perovskite and spinel, a binary oxide of a transition metal, etc., as a recording material.

In using these materials, in regard to writing/erasing, a low-resistance state (on) and a high-resistance state (off) can repeatedly be changed by an application of a voltage pulse. That is, by corresponding these two states to binary 0 and 1, such can be made to function as a memory for recording data.

Further, in regard to reading, it is performed by flowing a small read current that will not cause the writing/erasing in the recording material, and measuring the electrical resistance of the recording material. In general, a ratio of the resistance of a high-resistance phase and the resistance of a low-resistance phase is about $10^3$.

What is most characteristic in this type of resistance-change material is that it is operable in principle even if an element size is reduced to about 10 nm. In this case, a bit density of about 10 terabytes per square inch (Tbpsi) can be realized.

Further, such a resistance-change memory is also useful for three-dimensional configurations.

However, in a resistance-change memory that is configured three-dimensionally as above, in accordance with an increase in a number of stacked layers, a number of times of alignment upon using a photoetching process (PEP) increases. Further, since one alignment is performed by identifying a level difference (alignment mark) of a topmost layer, a special process for constantly remaining this level difference in the topmost layer becomes necessary.

BRIEF DESCRIPTION OF THE DRAWINGS

FIG. 3 shows a second example of device structure;
FIGS. 6 to 17 show a first example of manufacturing method;
and
FIGS. 18 to 23 show a second example of manufacturing method.

DETAILED DESCRIPTION

Figure 1:
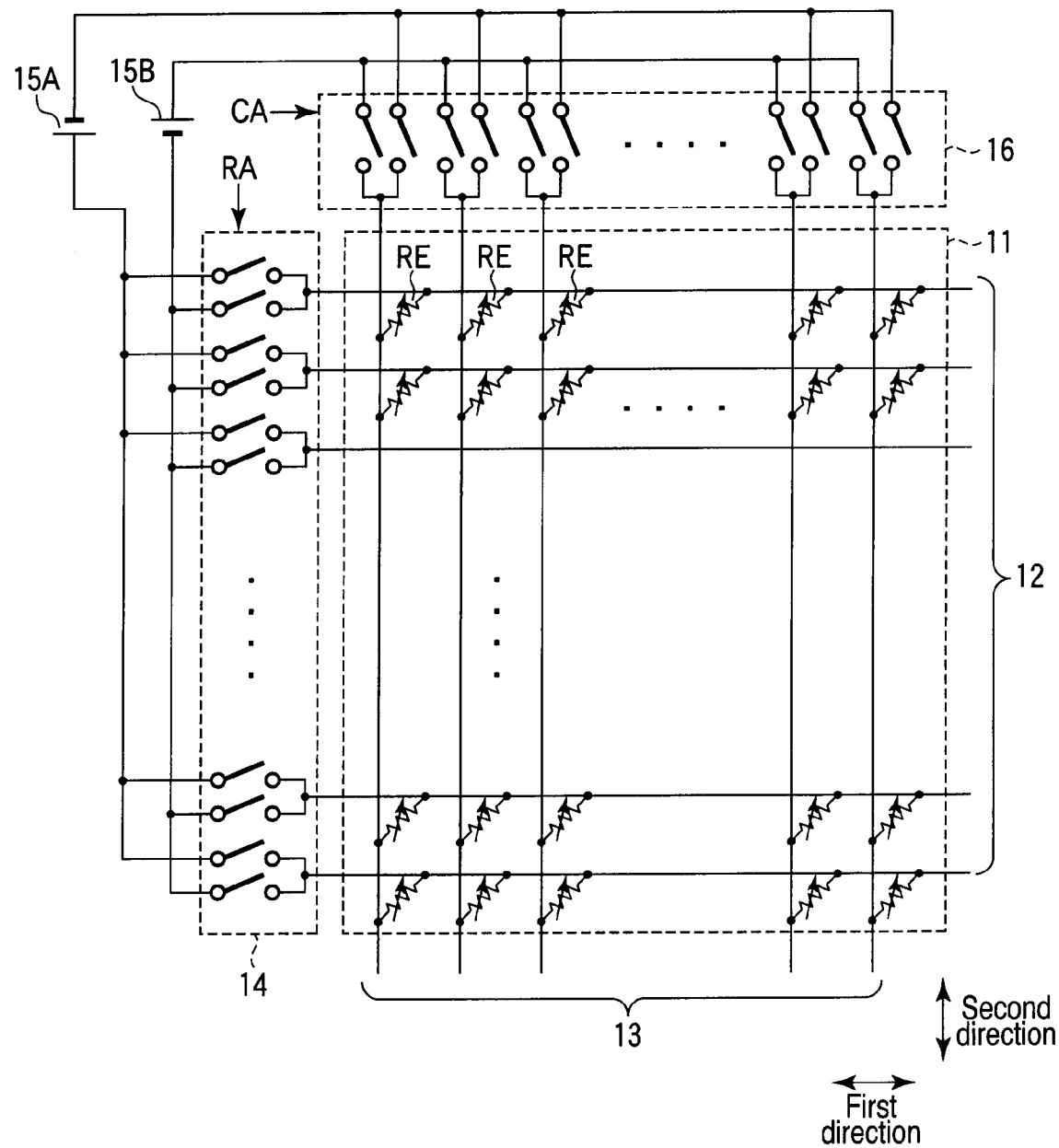
FIG. 1 shows a cross-point resistance-change memory.

In general, according to one embodiment, an information recording/reproducing device comprising: a semiconductor substrate; a first interconnect layer on the semiconductor substrate; a first memory cell array layer on the first interconnect layer; and a second interconnect layer on the first memory cell array layer, wherein the first memory cell array layer comprises an insulating layer having an alignment mark, and a stacked layer structure on the insulating layer and including a storage layer and an electrode layer, and all of the layers in the stacked layer structure comprises a material with a permeability of visible light of 1% or more.

1. OUTLINES

In an example of the embodiment, in an information recording/reproducing device comprising a structure in which a storage layer and an electrode layer are stacked on an insulating layer in which an alignment mark is formed, by configuring the storage layer and the electrode layer respectively from transparent materials with a light permeability with respect to visible light of 1% or more, a highly accurate alignment is realized without needing a special process for remaining a level difference (alignment mark) on a topmost layer.

That is, if the storage layer and the electrode layer formed in higher layers than the insulating layer in which the alignment mark is formed are of the transparent materials, even with no level difference at the topmost layer, the alignment mark in a lower layer can be identified, for example, by CCD, thus PEP as the special process can be omitted, and a contribution can be made in regard to reducing the manufacturing cost.

Especially, in a three-dimensionally configured information recording/reproducing device configured of n (n being a natural number of 2 or more) layers of stacked memory cell array layers, when the alignment mark is to be formed in each memory cell array layer, (n−1) times of PEPs can be omitted compared to the conventional technique.

In other words, the alignment mark may be provided only in a memory cell array layer of a lowermost layer (first layer), and alignment of all of the memory cell array layers may be performed based on that alignment mark. In this case, as for the memory cell array layers from a second layer to the topmost layer, formation of the alignment marks itself can be omitted.

2. PRINCIPLES OF THE EMBODIMENTS

Those who carried out the embodiments had focused on a so-called process cost among manufacturing costs.

In a current, so-called semiconductor memory, although a so-called lithography technique of producing shapes of elements, etc., by a series of processes of "resist application→exposure→developing" (hereinbelow PEP) has been used, when the number of times of PEPs increases, time and effort are increased, and this becomes one reason of a drop in a productivity.

Although it is a natural consequence, if the productivity drops, since a production line is occupied longer to produce the same product, thus a production cost is increased thereby.

Therefore, a demand to keep the number of times of PEP as small as possible arises. As described in the BACKGROUND, when stacking layers (three-dimensional configuration) is to be performed for lowering cost, such demand arises all the more.

Incidentally, in performing PEP, the alignment becomes necessary.

This alignment is performed by identifying an alignment mark, so in order to do so, the level difference (alignment mark) needs to be remained in the topmost layer upon layer stacking. Further, in order to remain the level difference in the topmost layer, the level difference that had disappeared by the stacking step needs to be restored by PEP and RIE.

Since this means that a new PEP will be necessary to restore the level difference, it contradicts with the aforementioned demand to reduce the number of times of PEP.

Therefore, in the embodiment, firstly, it is proposed to identify the alignment mark by brightness caused by a difference in the materials, instead of identifying it by the level difference.

For example, as for the alignment mark formed on an upper surface of the insulating layer as a groove, the groove is filled with a conductive layer, and the alignment mark is identified by determining the brightness of the insulating layer and the conductive layer.

By configuring as above, since the special process (PEP and RIE) for remaining the level difference for alignment becomes unnecessary, a contribution can be made in regard to reducing a manufacturing cost.

However, in identifying the alignment mark by the brightness caused by the difference in the materials, if a material that does not allow visible light to penetrate, or a material with the permeability of visible light of less than 1% (hereinbelow, these are referred to as opaque material) is present above the alignment mark, the alignment mark cannot be identified, and the embodiment cannot be materialized.

Thus, in the embodiment, it is proposed to configure all of the stacked layers to be stacked above the alignment mark with materials with the permeability of visible light of 1% or more (hereinbelow referred to as transparent materials).

The stacked layers above the alignment mark includes the insulating layer, the storage layer and the electrode layer. The insulating layer is formed of silicon oxide, etc., and generally has transparency, thus in the embodiment, the storage layer and the electrode layer above the alignment mark are to be the objects.

Specific materials of the storage layer and the electrode layer will be described later.

Here, the electrode layer refers to a conductive layer including a metal element connected to the storage layer and conductive lines.

Further, the storage layer is a layer that stores binary or greater values in a non-volatile manner. Although it is not limited as to what kind of principle by which the storage layer stores data, in the embodiment, a resistance-change material layer that stores data by a resistance change in a material is to be the object.

Incidentally, whether to be a transparent material or not is influenced by its thickness, in addition to its material. Therefore, in the embodiment, when a transparent material is specified, it is also proposed as to an optimal thickness of the transparent material.

The embodiment is especially useful for a three-dimensionally configured cross-point resistance-change memory. This resistance-change memory is configured of stacked memory cell array layers, and a basic structure of one memory cell array layer is insulating layer (including a Damascene-structured conductive line)/barrier metal layer/polysilicon layer (diode)/storage layer/electrode layer/insulating layer (including a Damascene-structured conductive line).

In this case, the alignment mark is formed in the insulating layer that is the lowermost layer of one memory cell array layer, and since the respective layers thereabove may simply be patterned by using this alignment mark, an effect of manufacturing cost reduction becomes significant by adapting the embodiment to a three dimensional memory as the above.

That is, the embodiment becomes more useful as the number of the memory cell array layers to be stacked increases as the three-dimensional configuration is further progressed.

3. PERMEABILITY OF VISIBLE LIGHT

In the embodiment, a transparent material with the permeability of visible light of 1% or more is used as the stacked layers to be stacked above the alignment mark.

The alignment mark can be identified by detecting the brightness with respect to visible light of the alignment mark (conductive layer) and the surrounding insulating layer by detecting the same as an intensity in a CCD image. That is, when the alignment mark is to be identified by CCD, S/N ratio in the CCD should be taken into consideration, and preferably the permeability of visible light is made to be 1% or more so that a signal and a noise can be distinguished.

By using such a transparent material, a contour of the alignment mark can be grasped precisely, and the accuracy of alignment is improved.

As the transparent material configuring the storage layer, the followings may be considered.

$$L1_x M1_y X_4 \ (0.1 \leq x \leq 2.2, 1.8 \leq y \leq 2), \quad \text{(i)}$$

$$L1_x M1_y X_3 \ (0.5 \leq x \leq 1.1, 0.9 \leq y \leq 1), \quad \text{(ii)}$$

$$L2_x M2_y X_4 \ (0.5 \leq x \leq 1.1, 0.9 \leq y \leq 1), \text{ and} \quad \text{(iii)}$$

$$M3_x O_y \ (0.5 \leq x \leq 1.1, 0.9 \leq y \leq 1), \quad \text{(iv)}$$

where L1 is at least one element selected from the group of Na, K, Rb, Be, Mg, Ca, Sr, Ba, Al, Ga, Mn, Fe, Co, Ni, Cu, Zn, Ge, Ag, Au, Cd, Sn, Sb, Pt, Pd, Hg, Tl, Pb and Bi, M1 is at least one element selected from the group of Al, Ga, Ti, Ge, Sn, V, Cr, Mn, Fe, Co, Ni, Nb, Ta, Mo, W, Ru and Rh, L2 is at least one element selected from the group of Mg, Ca, Sr, Al, Ga, Sb, Ti, V, Cr, Mn, Fe, Co, Rh, In, Sb, Tl, Pb and Bi, M2 is at least one element selected from the group of Al, Ga, Ti, Ge, Sn, V, Nb, Ta, Cr, Mn, Mo, W, Ir and Os, and M3 is at least one element selected from the group of Al and transition metal elements.

In regard to (i) and (ii), L1 and M1 are elements that are different from one another, and in regard to (iii), L2 and M2 are elements that are different from one another.

X is at least one element selected from the group of O and N.

Further, when the storage layer is configured of one of the aforementioned (i) to (iv), a crystal structure of the storage layer is preferably selected from the group of spinel structure, cryptomelane structure, ilmenite structure, marokite structure, hollandite structure, hetaerolite structure, ramsdellite structure, delafossite structure, wolframite structure, α-NaFeO$_2$ structure, NaCl structure and LiMoN$_2$ structure.

Moreover, a material selected from the group of TiN, WN, TaN, Pt, Ir, Ru, IrO$_2$, RuO$_2$, Al, Cu, W, Ti, Ta, Nb and Mo may be arranged between the aforementioned electrode layer and the storage layer.

As the transparent material configuring the electrode layer, below may be considered.

$$Al_{1-x} B1_x O_y \quad \text{(i)}$$

Note that A1 is at least one element selected from the group of Sn and Pb, B1 is at least one element selected from the group of P, As, Sb and Bi, O is elemental oxygen, and $0.01 \leq x \leq 0.15$, $1.5 \leq y \leq 2.8$.

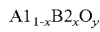  (ii)

Note that A1 is at least one element selected from the group of Sn and Pb, B2 is at least one element selected from the group of F, Cl and Br, O is elemental oxygen, and $0.05 \leq x \leq 0.60$, $1.5 \leq y \leq 2.8$.

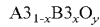  (iii)

Note that A3 is at least one element selected from the group of Zn and Cd, B3 is at least one element selected from the group of Al, Ga, B and In, O is elemental oxygen, and $0.01 \leq x \leq 0.20$, $1.5 \leq y \leq 2.8$.

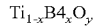  (iv)

Note that Ti is elemental titanium, B4 is at least one element selected from the group of V, Nb, Ta, Cr, Mo and W, O is elemental oxygen, and $0.01 \leq x \leq 0.20$, $1.5 \leq y \leq 2.8$.

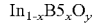  (v)

Note that In is elemental indium, B5 is at least one element selected from the group of Zn, Cd, Ge and Sn, O is elemental oxygen, and $0.01 \leq x \leq 0.20$, $1.5 \leq y \leq 2.8$.

Further, thicknesses of these electrode layers are preferably 250 nm or more and 5 μm or less. A reason therefor will be explained.

For example, when a basic structure of the memory cell array layer is configured by insulating layer (including Damascene-structured conductive lines)/barrier metal layer/polysilicon layer (diode)/storage layer/electrode layer/insulating layer (including Damascene-structured conductive lines), the electrode layer is used as a stopper layer upon CMP in one step in a manufacturing process.

Here, the stopper layer needs to secure thickness of at least 200 nm in order for it to absorb processing (etching) variability, and to be given the role of the stopper upon CMP.

Further, the electrode layer configured of the aforementioned transparent material (oxide) generally has resistivity that is higher than metal such as W (tungsten) by one to two digits. Because of this, a resistance difference between the electrode layer and its surrounding oxide (e.g., silicon oxide) is small, and a terminating point during the CMP becomes difficult to judge.

That is, because of an occurrence of an excessive removal of the stopper layer (electrode layer), the thickness of the electrode layer as the stopper layer is desired to be somewhat thicker than 200 nm. Accordingly, a lower limit of the thickness of the electrode layer becomes 250 nm.

On the other hand, if the electrode layer as the stopper layer is too thick, then an aspect ratio of a height (thickness) and a width of the electrode layer becomes too large, and the processing of the electrode layer becomes difficult. Because of this, in an information recording/reproducing device with a half pitch of the conductive lines (word lines/bit lines) of 200 nm or less, an upper limit of the thickness of the electrode layer becomes 5 μm.

Further, if the thickness of the electrode layer as the stopper layer exceeds 5 μm, the permeability of visible light may become less than 1%, and the problem that the alignment mark becomes difficult to identify by the CCD also arises.

According to the above reason, the thickness of the electrode layer can be said as preferably being 250 nm or more and 5 μm or less.

4. EMBODIMENTS

(1) Structure

A. Memory Cell Array Structure

FIG. 1 shows a memory cell array of a cross-point resistance-change memory.

Memory cell array 11 comprises resistance-change elements RE arranged in an array in a first direction and a second direction. Conductive lines (word lines/bit lines) 12 extending in the first direction are connected to one ends of resistance-change elements RE, and conductive lines (word lines/bit lines) 13 extending in the second direction are connected to the other ends of resistance-change elements RE.

One end of conductive lines 12 is connected to a positive electrode of power source 15A and a negative electrode of power source 15B via switching circuit 14. Further, One end of conductive lines 13 is connected to a negative electrode of power source 15A and a positive electrode of power source 15B via switching circuit 16.

In a cross-point resistance-change memory as above, by controlling the on/off state of switching circuits 14, 16 by control signals RA and CA, a current or voltage with a certain orientation is applied to one selected resistance-change element RE, thereby to perform basic operations of writing/erasing/reading.

B. First Example of a Device Structure

Figure 2:
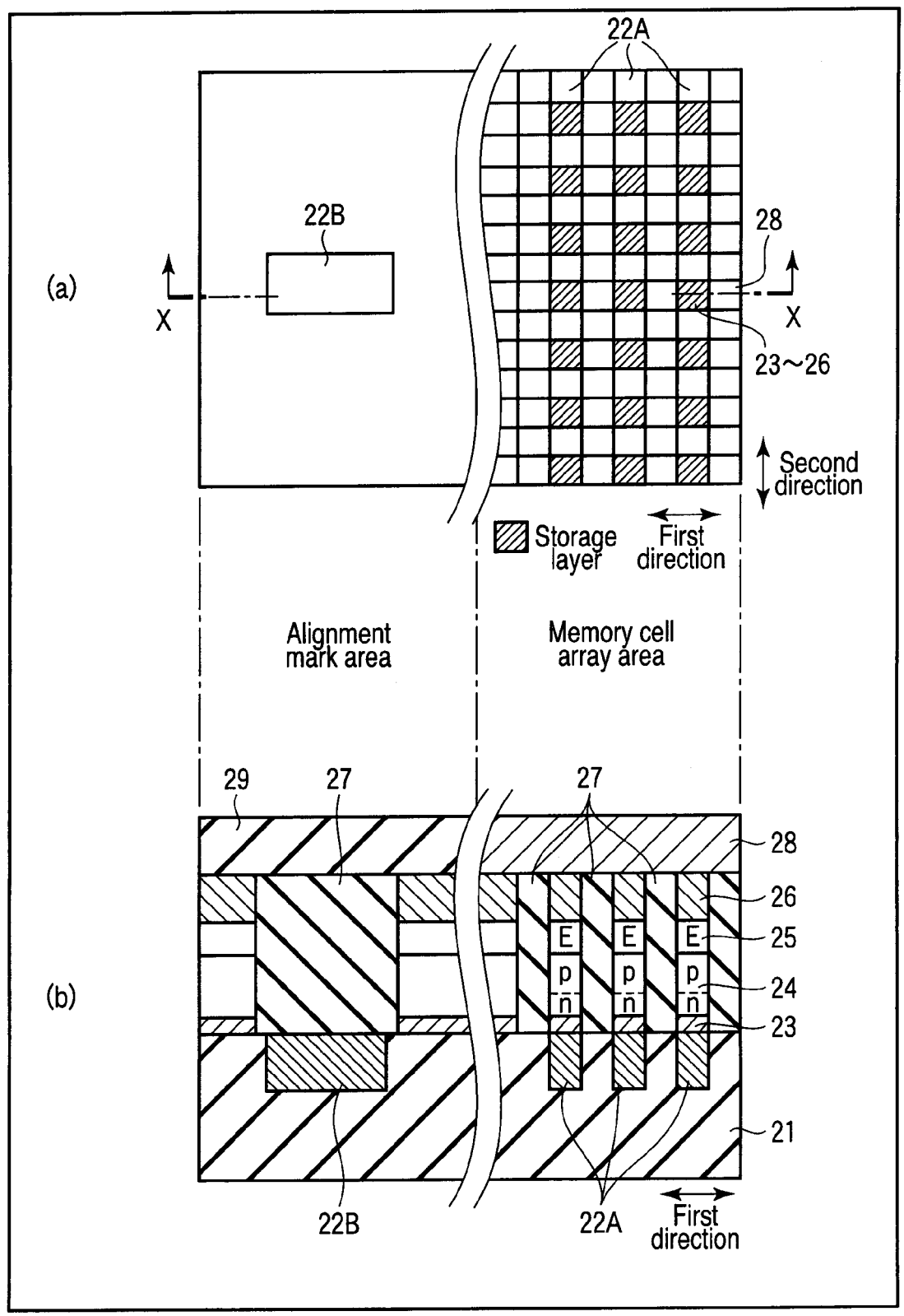
FIG. 2 shows a first example of device structure.

FIG. 2 shows a first example of a device structure of an embodiment.

(a) of this figure is a plan diagram of the device structure of the first example, and (b) of this figure is a cross-sectional diagram along line X-X in (a) of this figure.

In a memory cell array area, grooves extending in the second direction (direction vertical to a sheet surface) are formed on insulating layer (e.g., silicon oxide) 21, and conductive lines (e.g., tungsten) 22A having the damascene structure are formed in the grooves.

Here, the damascene structure is a wiring structure formed by a damascene process (including a single damascene process and dual damascene process).

Further, in an alignment mark area, a groove is formed in insulating layer 21, and alignment mark 22B configured of a conductive layer (e.g., tungsten) is formed in the groove.

On conductive line 22A, barrier metal layer 23, polysilicon layer (diode) 24, storage layer (E) 25, and electrode layer 26 are formed. Further, insulating layer (e.g., silicon oxide) 27 is formed on alignment mark 22B.

In the memory cell array area, conductive line (e.g., tungsten) 28 extending in the first direction is formed on electrode layer 26. Conductive line 28 is formed in a groove of insulating layer (e.g., silicon oxide) 29, and has the damascene structure.

This device structure is characteristic in that alignment mark 22B is configured of the conductive layer filled in the groove of insulating layer 21, and that insulating layer 27 formed of a transparent material that allows visible light to penetrate is formed above alignment mark 22B.

C. Second Example of the Device Structure

FIG. 3 shows a second example of the device structure of the embodiment.

(a) of this figure is a plan diagram of the device structure of the second example, and (b) of this figure is a cross-sectional diagram along line Y-Y in (a) of this figure.

In a memory cell array area, grooves extending in the second direction (direction vertical to a sheet surface) are formed in insulating layer (e.g., silicon oxide) 21, and conductive lines (e.g., tungsten) 22A having the damascene structure are formed in the grooves.

Further, in an alignment mark area, a groove is formed in insulating layer 21, and alignment mark 22B configured of a conductive layer (e.g., tungsten) is formed in the groove.

On conductive line 22A, barrier metal layer 23, polysilicon layer (diode) 24, storage layer (E) 25, and electrode layer 26 are formed. Similarly, barrier metal layer 23, polysilicon layer 24, storage layer 25, and electrode layer 26 are formed on alignment mark 22B.

In the memory cell array area, conductive line (e.g., tungsten) 28 extending in the first direction is formed on electrode layer 26. Conductive line 28 is formed in a groove of insulating layer (e.g., silicon oxide) 29, and has the damascene structure.

This device structure is characteristic in that alignment mark 22B is configured of the conductive layer filled in the groove of insulating layer 21, and that a stacked layer structure formed of transparent materials that allow visible light to penetrate is formed above alignment mark 22B.

D. Third Example of the Device Structure

Figure 4:
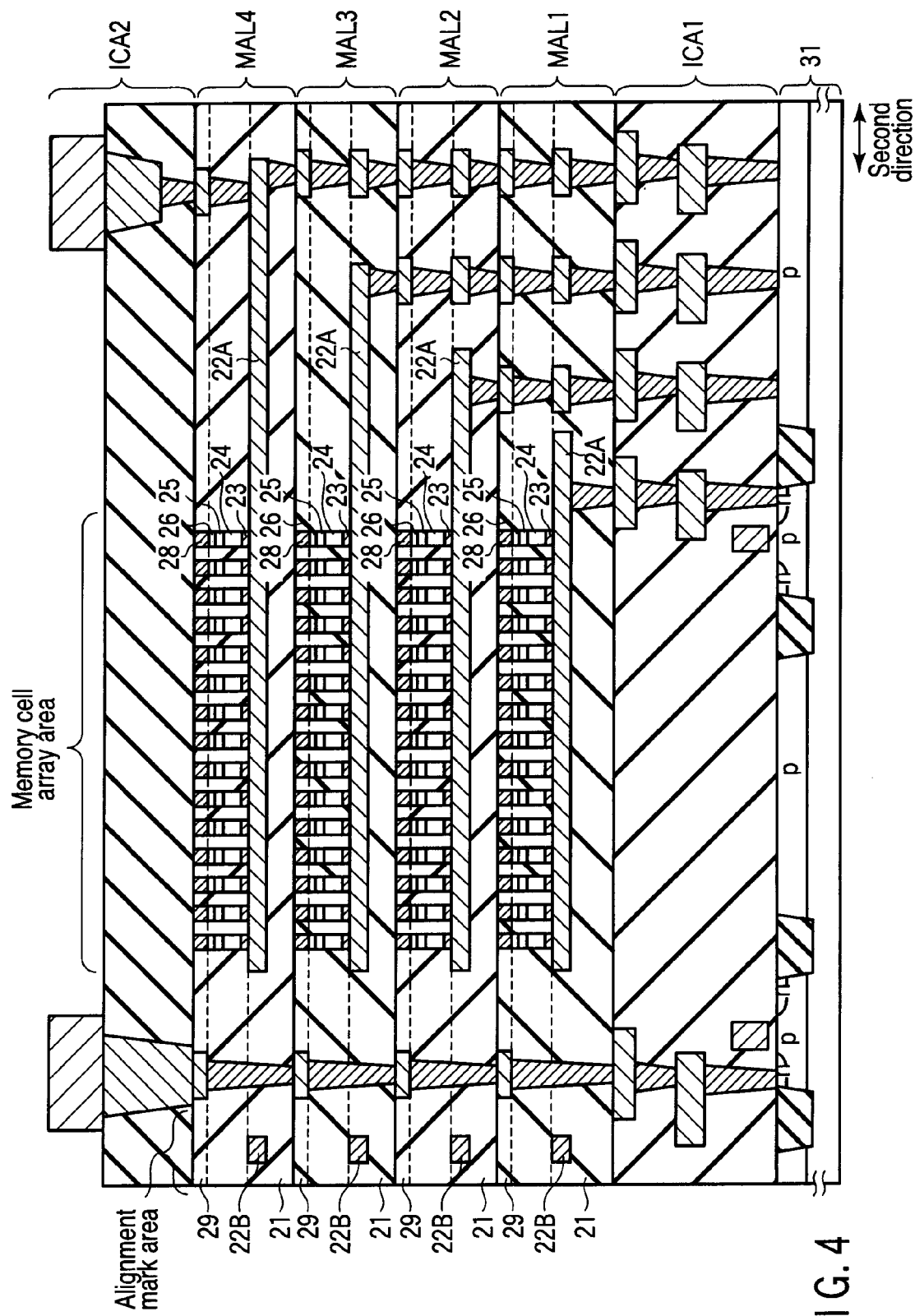
FIG. 4 shows a third example of device structure.

FIG. 4 shows a third example of the device structure of the embodiment.

This device structure comprises a three-dimensional structure in which memory cell array layers MAL1, MAL2, MAL3 and MAL4 are stacked on semiconductor substrate 31.

On semiconductor substrate 31, first interconnect layer ICA1 is formed, and on first interconnect layer ICA1, memory cell array layers MAL1, MAL2, MAL3 and MAL4 are formed, and on memory cell array layers MAL1, MAL2, MAL3 and MAL4, second interconnect layer ICA2 is formed.

Each of memory cell array layers MAL1, MAL2, MAL3 and MAL4 has the device structure of FIG. 2 or FIG. 3.

That is, in the memory cell array area, a stacked layer structure formed of insulating layer 21, barrier metal layer 23, polysilicon layer 24, storage layer 25 and electrode layer 26 is formed. Insulating layer 21 includes conductive lines 22A having the damascene structure, and insulating layer 29 includes conductive line 28 having the damascene structure.

In the alignment mark area, alignment mark 22B configured of a conductive layer is formed.

In the third example, although four memory cell array layers MAL1, MAL2, MAL3 and MAL4 are exemplified, the memory cell array layer may be one.

E. Fourth Example of the Device Structure

Figure 5:
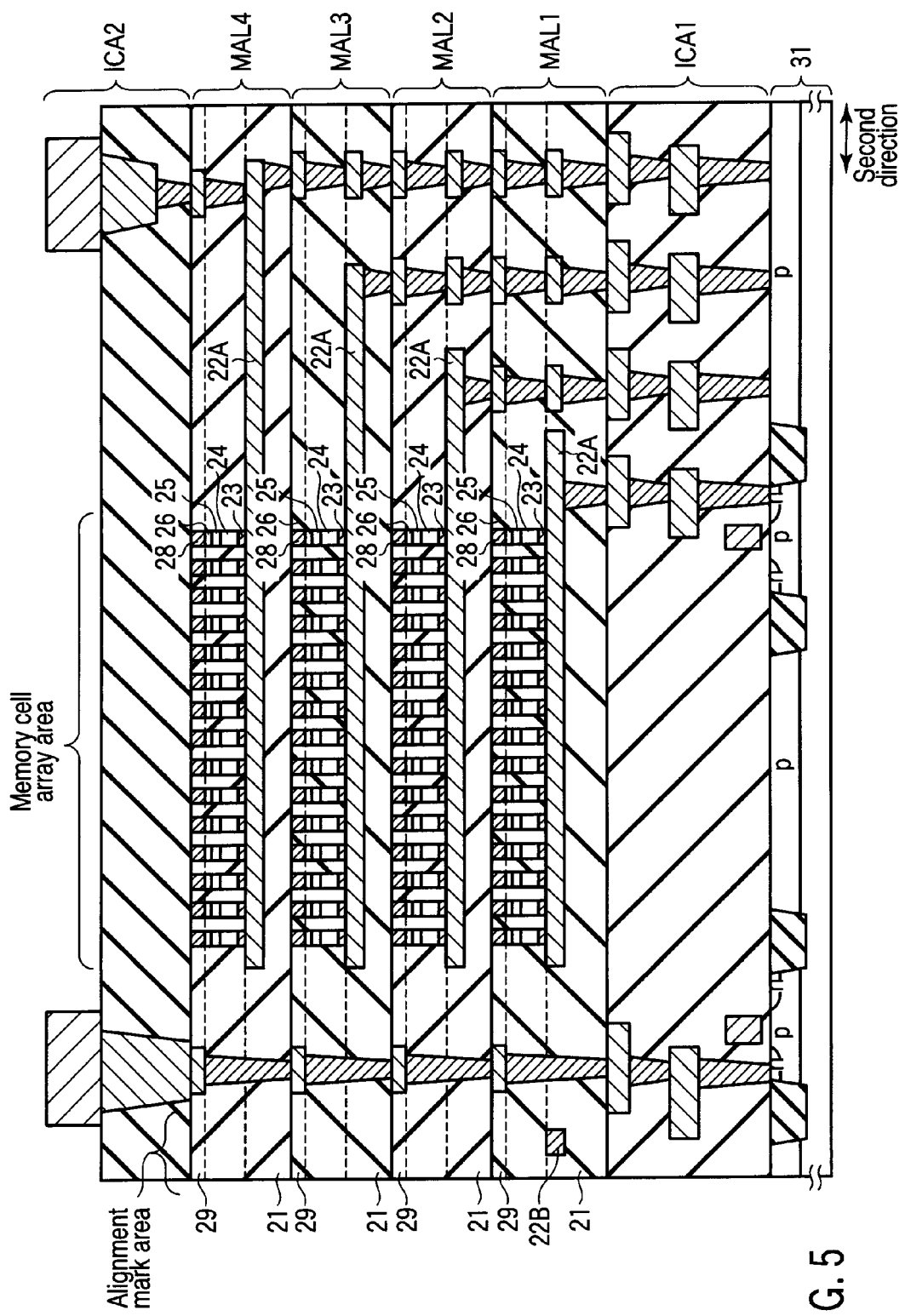
FIG. 5 shows a fourth example of device structure.

FIG. 5 shows a fourth example of the device structure of the embodiment.

This device structure comprises the three-dimensional structure in which memory cell array layers MAL1, MAL2, MAL3 and MAL4 are stacked on semiconductor substrate 31.

On semiconductor substrate 31, first interconnect layer ICA1 is formed, and on first interconnect layer ICA1, memory cell array layers MAL1, MAL2, MAL3 and MAL4 are formed, and on memory cell array layers MAL1, MAL2, MAL3 and MAL4, second interconnect layer ICA2 is formed.

Each of memory cell array layers MAL1, MAL2, MAL3 and MAL4 has the device structure of FIG. 2 or FIG. 3.

That is, in the memory cell array area, a stacked layer structure formed of insulating layer 21, barrier metal layer 23, polysilicon layer 24, storage layer 25 and electrode layer 26 is formed. Insulating layer 21 includes conductive line 22A having the damascene structure, and insulating layer 29 includes conductive line 28 having the damascene structure.

In the alignment mark area, alignment mark 22B configured of the conductive layer is formed only for memory cell array layer MAL1 that is the lowermost layer.

In the fourth example, although four memory cell array layers MAL1, MAL2, MAL3 and MAL4 are exemplified, the memory cell array layer of the lowermost layer may be one. In this case, the fourth example is identical to the third example.

(2) Manufacturing Method

A. First Example

A first example relates to a manufacturing method for the device structure of FIG. 2.

Figure 6:
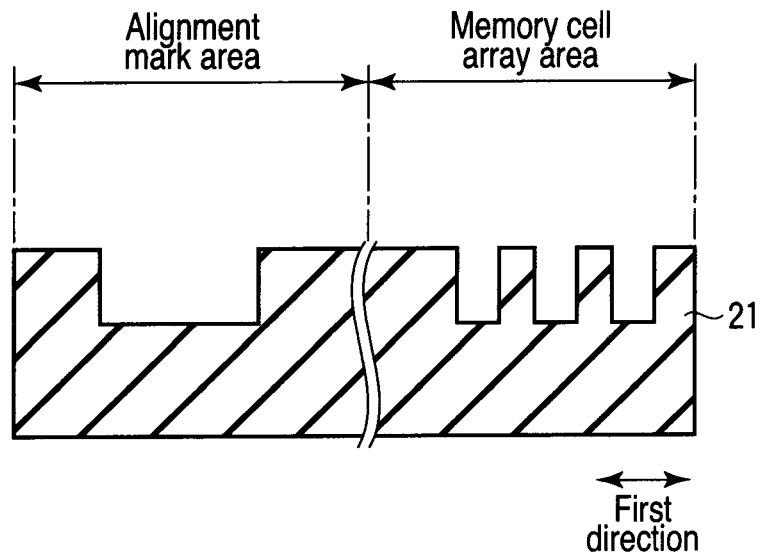

Firstly, as shown in FIG. 6, wiring grooves and grooves for alignment marks are respectively formed in insulating layer 21 using PEP. The wiring grooves extend in the second direction (direction vertical to a sheet surface), and the grooves for the alignment marks are configured, for example, of square shape, circular shape, oval shape, or a combination thereof.

Figure 7:
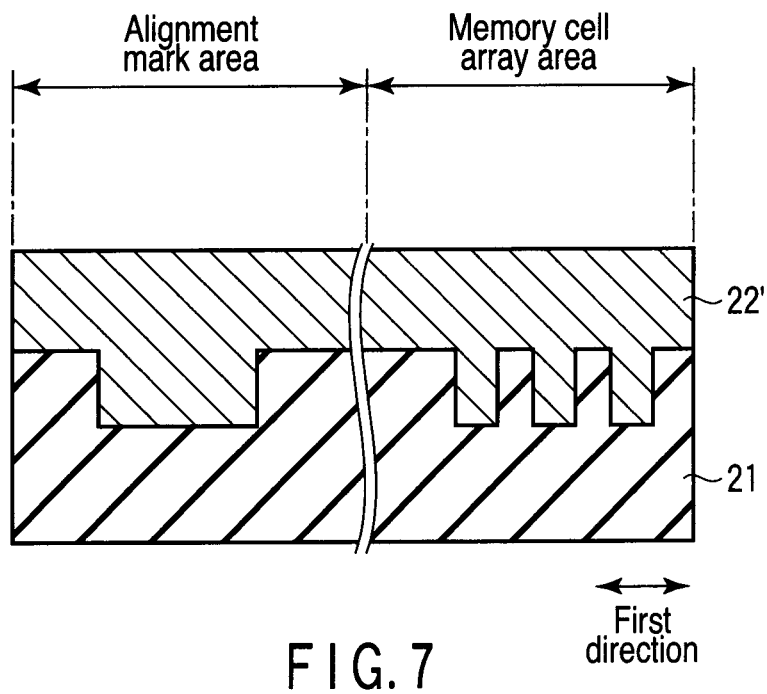

Next, as shown in FIG. 7, conductive layer 22' that completely fills the wiring grooves and the grooves for the alignment marks is formed on insulating layer 21 using sputtering technique. Thereafter, by polishing conductive layer 22' using the CMP, in the memory cell array area, as shown in FIG. 8, conductive lines (word lines/bit lines) 22A having the damascene structure are formed, and in the alignment mark area, alignment mark 22B is formed.

Figure 8:
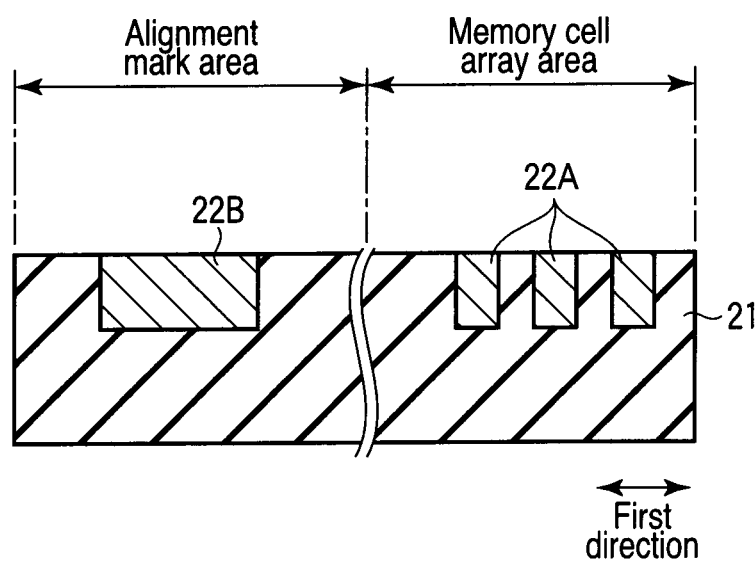

Here, in the step of FIG. 7, if conductive layer 22' is configured of tungsten, since the resistivity of tungsten is about $6\times10^{-6}$ $\Omega\cdot$cm, it is preferable to determine the thickness of conductive line 22A (depth of the groove) to be about 200 nm in a step of FIG. 8. Note that tungsten has the visible light permeability of 0%, and is an opaque material.

Here, in the embodiment, since alignment mark 22B is configured of the conductive layer in the groove, so the special step of removing the conductive layer inside the groove is not necessary. That is, according to the present embodiment, PEP can be reduced one time compared to the conventional case.

Specifically, in the conventional case, as shown in FIG. 9 and FIG. 10, resist pattern 31 is formed by PEP, and conductive layer 22B in the alignment mark area needs to be removed with the resist pattern 31 as a mask. In contrast, in the embodiment, the steps corresponding to FIG. 9 and FIG. 10 are not necessary.

Next, as shown in FIG. 11, barrier metal layer 23, polysilicon layer (diode) 24, storage layer 25 and electrode layer 26 are formed successively on insulating layer 21, on conductive lines 22A and on alignment mark 22B.

In this example ((a) in this figure), barrier metal layer 23 is TiN having the thickness of about 10 nm, and storage layer 25 is $ZnMn_2O_4$ or $Mn_3O_4$ having the thickness of about 30 nm. The thickness of polysilicon layer 24 is about 150 nm. Further, electrode layer 26 is $Sn_{0.9}Sb_{0.1}O_2$ having the thickness of about 250 nm.

Since barrier metal layer 23 and storage layer 25 are thin compared to other layers, the permeability of visible light becomes 1% or more. Further, as to storage layer 25, by using the aforementioned material, the permeability of visible light further can be improved.

Polysilicon layer 24 is originally transparent.

As to electrode layer 26, with $Sn_{0.9}Sb_{0.1}O_2$ having the thickness of about 250 nm, the permeability of visible light is 90%. Further, its resistivity is $8\times10^{-5}$ $\Omega\cdot$cm, and it can be used as electrode layer 26 without any problem.

Figure 12:
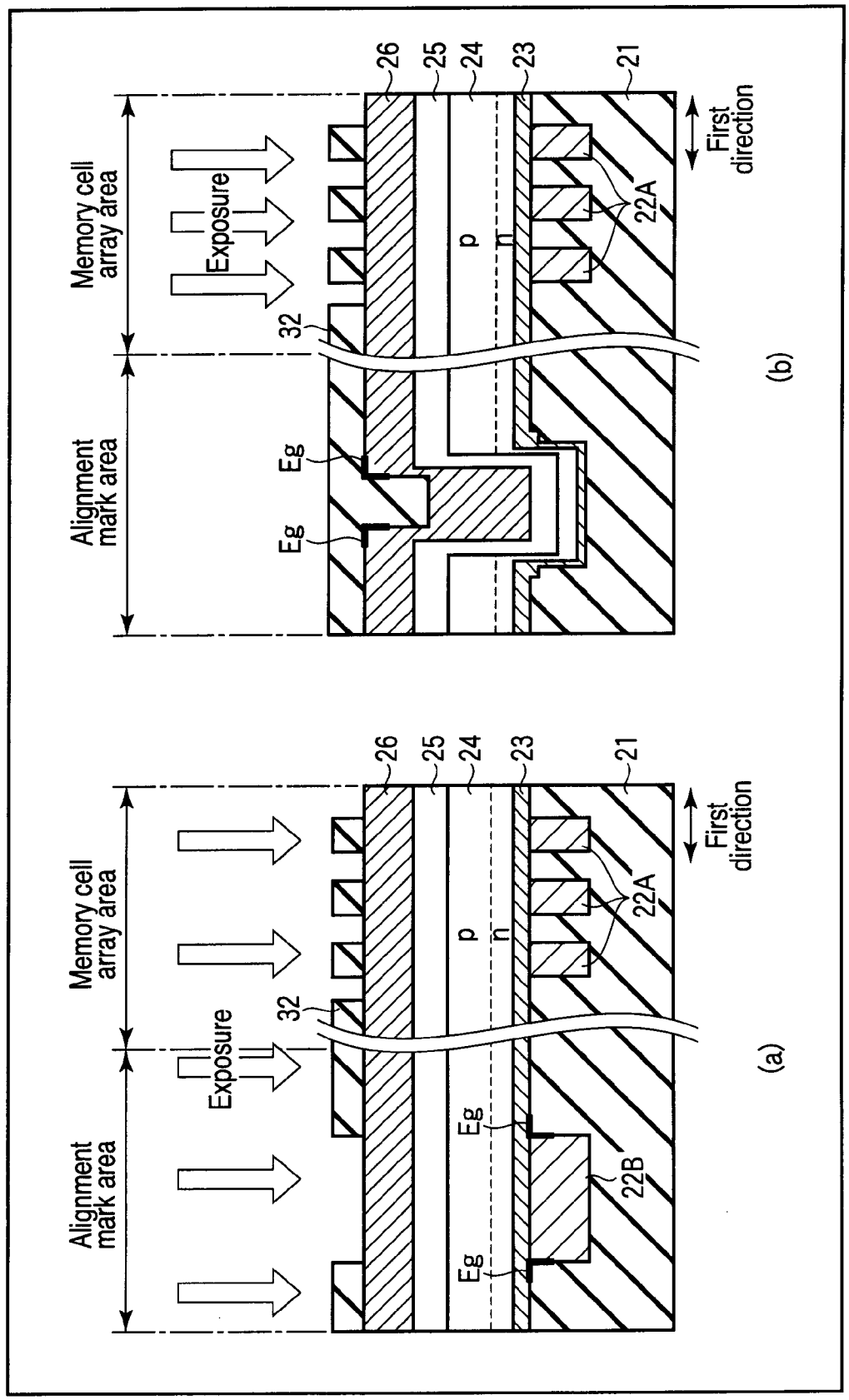

Then, resist layer 32' is formed on electrode layer 26, and after having performed the alignment, as shown in FIG. 12, resist pattern 32 is formed by PEP.

Here, in the step of FIG. 11, in the embodiment ((a) in the figure), since all of barrier metal layer 23, polysilicon layer 24, storage layer 25 and electrode layer 26 are configured of transparent materials, the alignment is performed by detecting edge Eg of alignment mark 22B in the lower layer.

In contrast, conventionally ((b) in the figure), the alignment is performed by detecting edge Eg of electrode layer (alignment mark) 26 that is the topmost layer.

Figure 13:
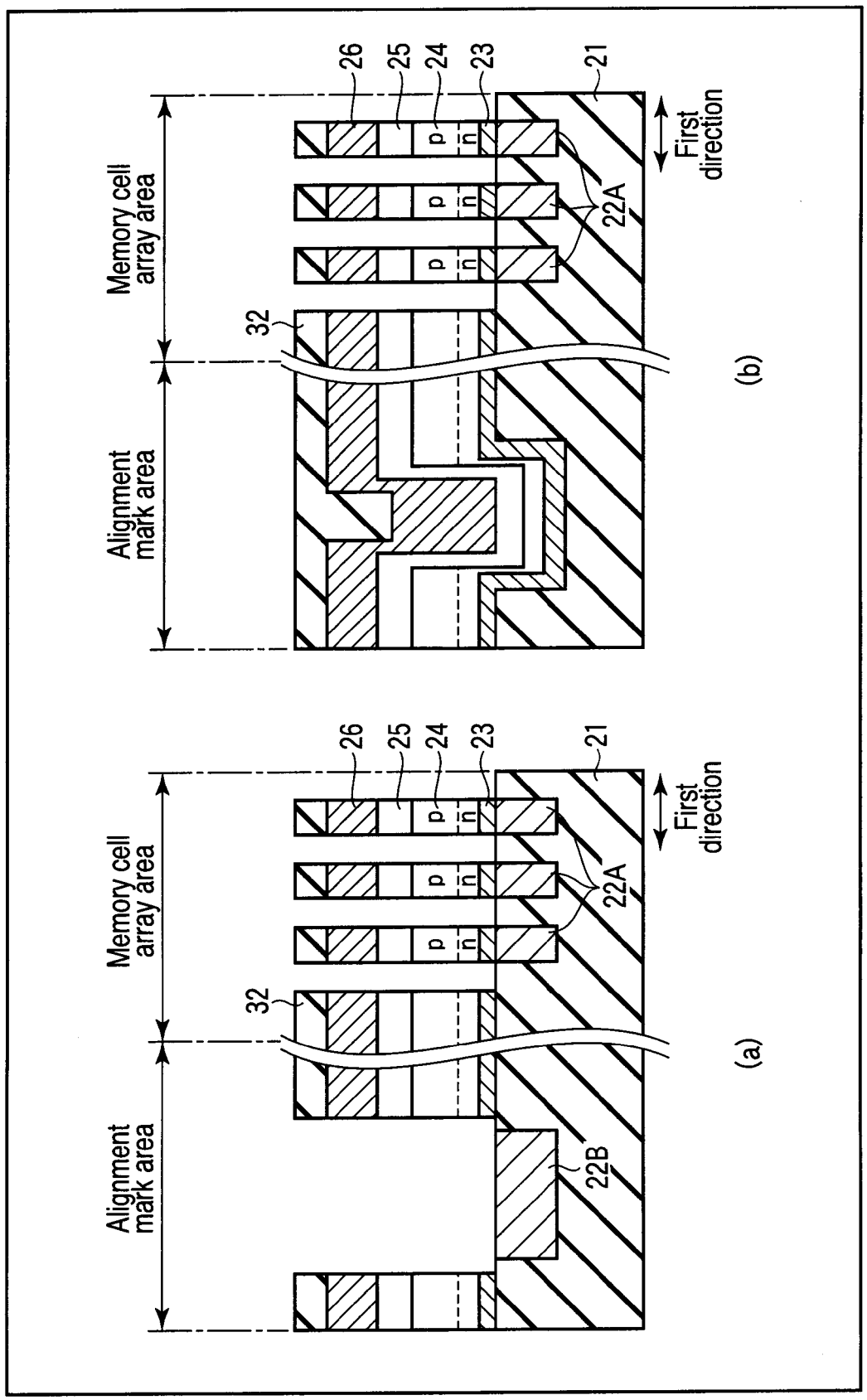

Next, as shown in FIG. 13, electrode layer 26, storage layer 25, polysilicon layer 24 and barrier metal layer 23 are successively etched by the RIE using resist pattern 32 as a mask.

This etching defines a planar shape of the resistance-change element.

That is, in the memory cell array area, a groove formed by this etching comes to be in a lattice shape configured from a combination of a straight line extending in the first direction and a straight line extending in the second direction, and the resistance-change elements in array configuration are formed between the lattice-shaped grooves.

At this time, in the present example, electrode layer 26, storage layer 25, polysilicon layer 24 and barrier metal layer 23 on alignment mark 22B are etched as well ((a) in the figure).

Thereafter, resist pattern 32 is removed.

Next, as shown in FIG. 14, insulating layer (e.g., silicon oxide) 27 is formed by CVD, and the grooves formed in the step of FIG. 13 is filled with insulating layer 27. The groove above alignment mark 22B is also filled with this insulating layer 27.

Further, an upper surface of insulating layer 27 is flattened by CMP. At this time, electrode layer 26 functions as the stopper for the CMP on insulating layer 27.

Next, as shown in FIG. 15, insulating layer 29 is formed on electrode layer 26 and on insulating layer 27. Further, after having flattened an upper surface of insulating layer 29, resist pattern 33 is formed on insulating layer 29 by PEP.

In the embodiment ((a) in the figure), the alignment at this time is performed by detecting edge Eg of alignment mark 22B, and conventionally ((b) in the figure), it is performed by detecting edge Eg of electrode layer (alignment mark) 26 that is the topmost layer.

Then, insulating layer 29 is etched by RIE using resist pattern 33 as the mask, and in the memory cell array area, grooves extending in the first direction are formed in insulating layer 29.

Thereafter, resist pattern 33 is removed.

Figure 16:
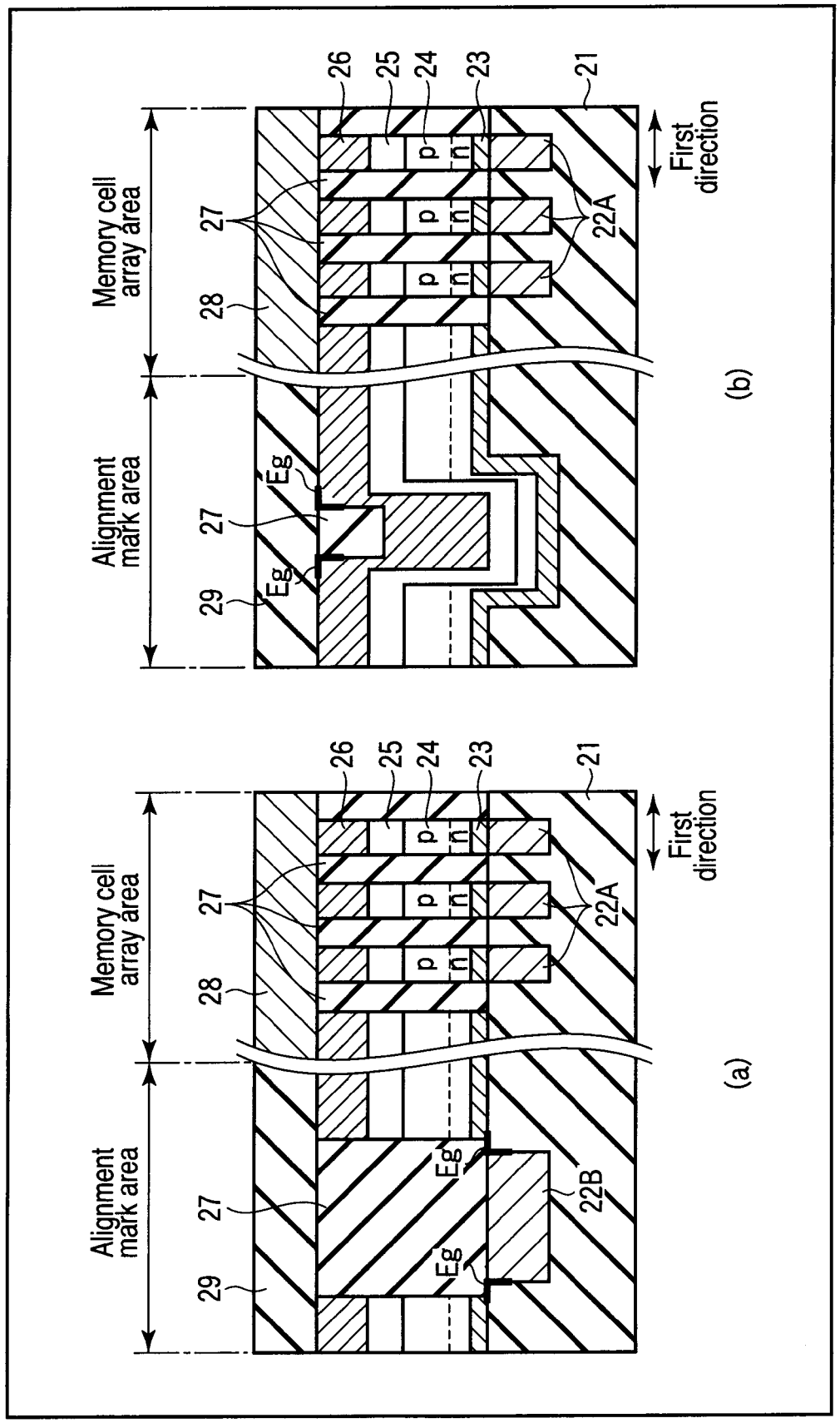

Next, as shown in FIG. 16, conductive layer (e.g., tungsten) 28 is formed on electrode layer 26 and insulating layers 27, 29 by sputtering.

Further, conductive layer 28 is polished by CMP, and remains conductive layer 28 in the grooves formed in insulating layer 29. Because of this, conductive layer 28 in the memory cell array area becomes the conductive lines (word lines/bit lines) having the damascene structure.

Here, even if conductive layer 28 is configured of the opaque material (e.g., tungsten), since conductive layer 28 above alignment mark 22B is removed by CMP, it does not affect the alignment hereafter.

Note that, in the present example, although electrode layer 26, storage layer 25, polysilicon layer 24 and barrier metal layer 23 on alignment mark 22B are removed in the step of FIG. 13, instead of this, they may be removed together with a removal of conductive layer 28 in the step of FIG. 15.

The device of FIG. 2 is completed by the aforementioned steps.

Here, this manufacturing method is an example of forming one memory cell array layer. When forming memory cell array layers that are stacked three-dimensionally, the aforementioned manufacturing method may be repeated.

Figure 17:
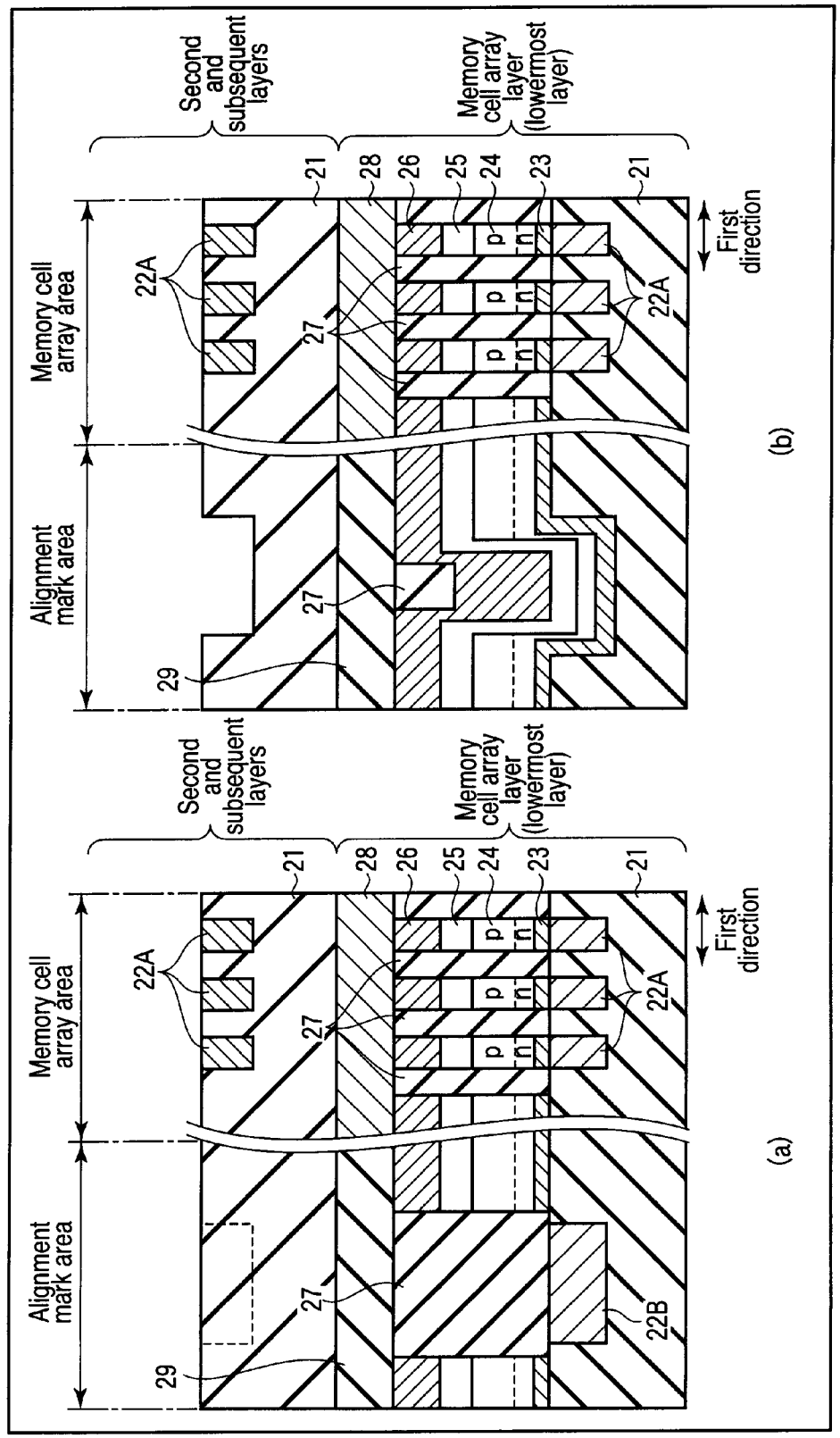

Further, in forming memory cell array layers, as shown in FIG. 17, in the embodiment ((a) in the figure), alignment mark 22B can be omitted for the second and subsequent memory cell array layers except for the lowermost layer.

In contrast, conventionally ((b) in the figure), the alignment mark is necessary for all of the memory cell array layers.

According to the manufacturing method of the first example, the device structure of FIG. 2 can be obtained easily, and in the manufacturing process, it can be understood that the number of PEP is made less. In addition, the alignment can be performed more accurately than it had conventionally been.

That is, in identifying the alignment mark by the level difference in the topmost layer, when the number of stacked layers becomes large, the level difference becomes obscure as a natural consequence. Further, increasing this level difference is limited because of the thickness of the insulating layer, etc.

In contrast, in the embodiment, the aforementioned problem does not occur at all, and the edge of the alignment mark does not become obscure.

B. Second Example

A second example relates to a manufacturing method for the device structure of FIG. 3.

Firstly, by processes identical to the first example (FIG. 6 to FIG. 11), steps until resist layer 32' is formed on electrode layer 26 and the alignment is performed are carried out.

In the second example, similar to the first example, conductive lines 22A are tungsten with the thickness (depth of grooves) of about 200 nm, barrier metal layer 23 is TiN with the thickness of about 10 nm, and storage layer 25 is $ZnMn_2O_4$ or $Mn_3O_4$ with the thickness of about 30 nm.

Further, the thickness of polysilicon layer 24 is about 150 nm. Further, electrode layer 26 is $Sn_{0.9}Sb_{0.1}O_2$ having the thickness of about 250 nm.

The alignment is performed by detecting edge Eg of alignment mark 22B, similar to the first example.

Figure 18:
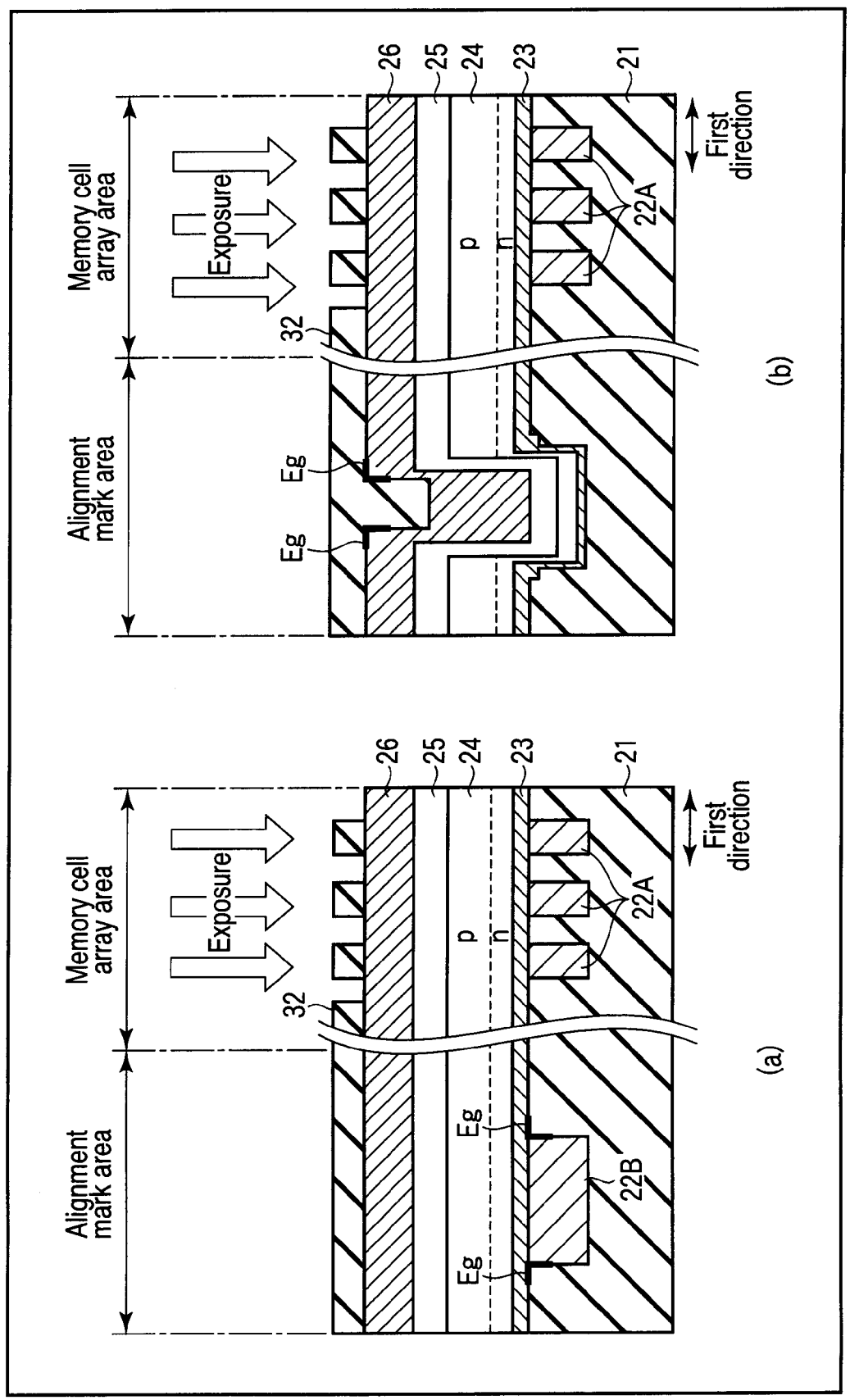

Then, after having performed the alignment, as shown in FIG. 18, resist pattern 32 is formed by PEP.

Here, although resist pattern 32 above alignment mark 22B is opened in the first example (FIG. 12), in the second example, an upper portion of alignment mark 22B is covered by resist pattern 32.

Next, as shown in FIG. 19, electrode layer 26, storage layer 25, polysilicon layer 24 and barrier metal layer 23 are successively etched by RIE using resist pattern 32 as the mask.

This etching defines the planar shape of the resistance-change element.

That is, in the memory cell array area, the groove formed by this etching comes to be in the lattice shape configured from the combination of the straight line extending in the first direction and the straight line extending in the second direction, and the resistance-change elements in array configuration are formed between the lattice-shaped grooves.

At this time, in the second example, electrode layer 26, storage layer 25, polysilicon layer 24 and barrier metal layer 23 on alignment mark 22B are not etched ((a) in the figure).

Even with these stacked layers above alignment mark 22B being remained, since all of these stacked layers are configured of the transparent materials, no problem will arise in the alignment hereafter.

Thereafter, resist pattern 32 is removed.

Figure 20:
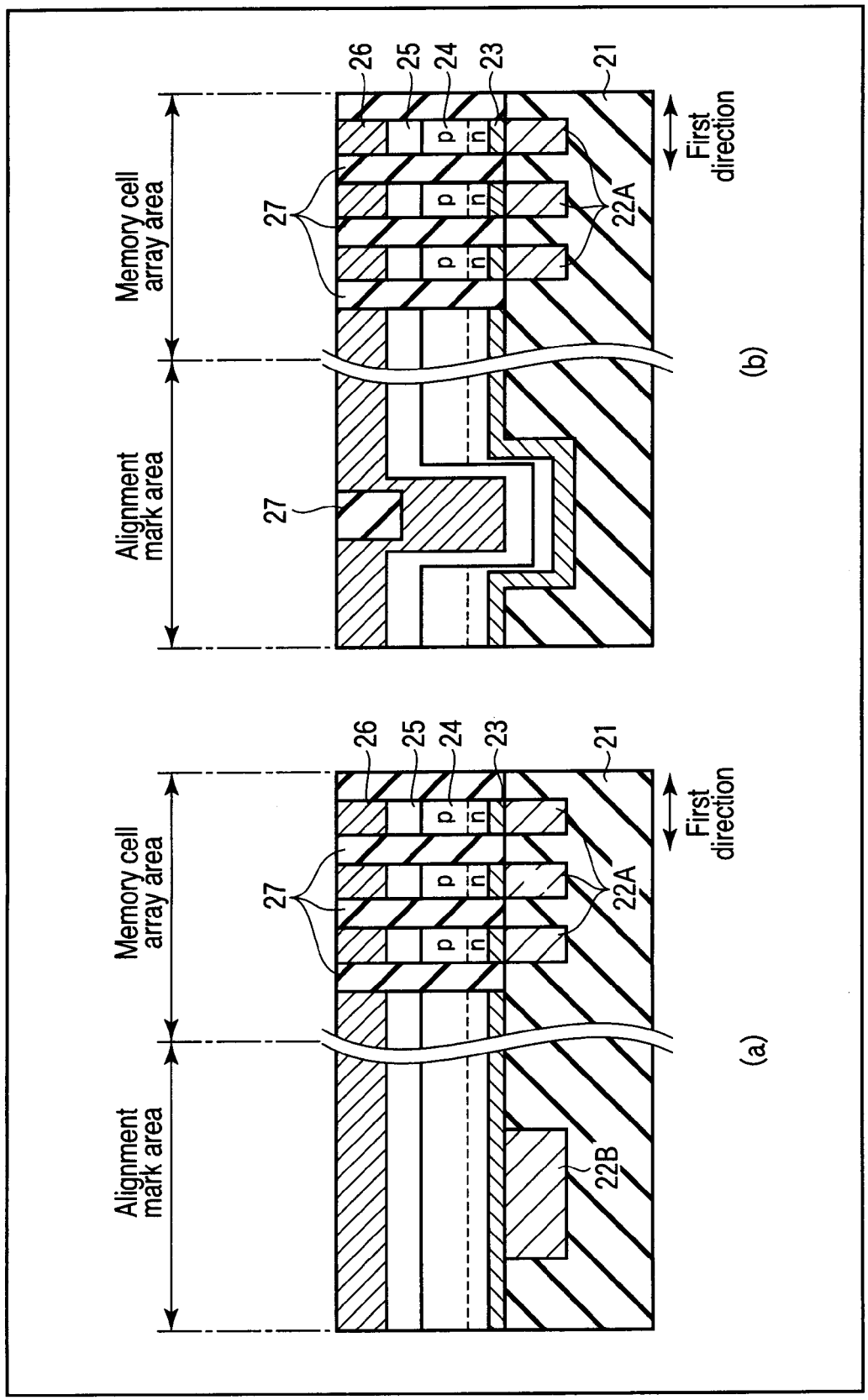

Next, as shown in FIG. 20, insulating layer (e.g., silicon oxide) 27 is formed by CVD, and the lattice-shaped grooves formed in the step of FIG. 19 is filled with insulating layer 27.

Further, the upper surface of insulating layer 27 is flattened by CMP. At this time, electrode layer 26 functions as the stopper for the CMP on insulating layer 27.

Next, as shown in FIG. 21, insulating layer 29 is formed on electrode layer 26 and insulating layer 27. Further, after having flattened the upper surface of insulating layer 29, resist pattern 33 is formed on insulating layer 29.

The alignment at this time is performed by detecting edge Eg of alignment mark 22B, similar to the first example ((a) in the figure).

Then, insulating layer 29 is etched by RIE using resist pattern 33 as the mask, and in the memory cell array area, grooves extending in the first direction are formed in insulating layer 29.

Thereafter, resist pattern 33 is removed.

Figure 22:
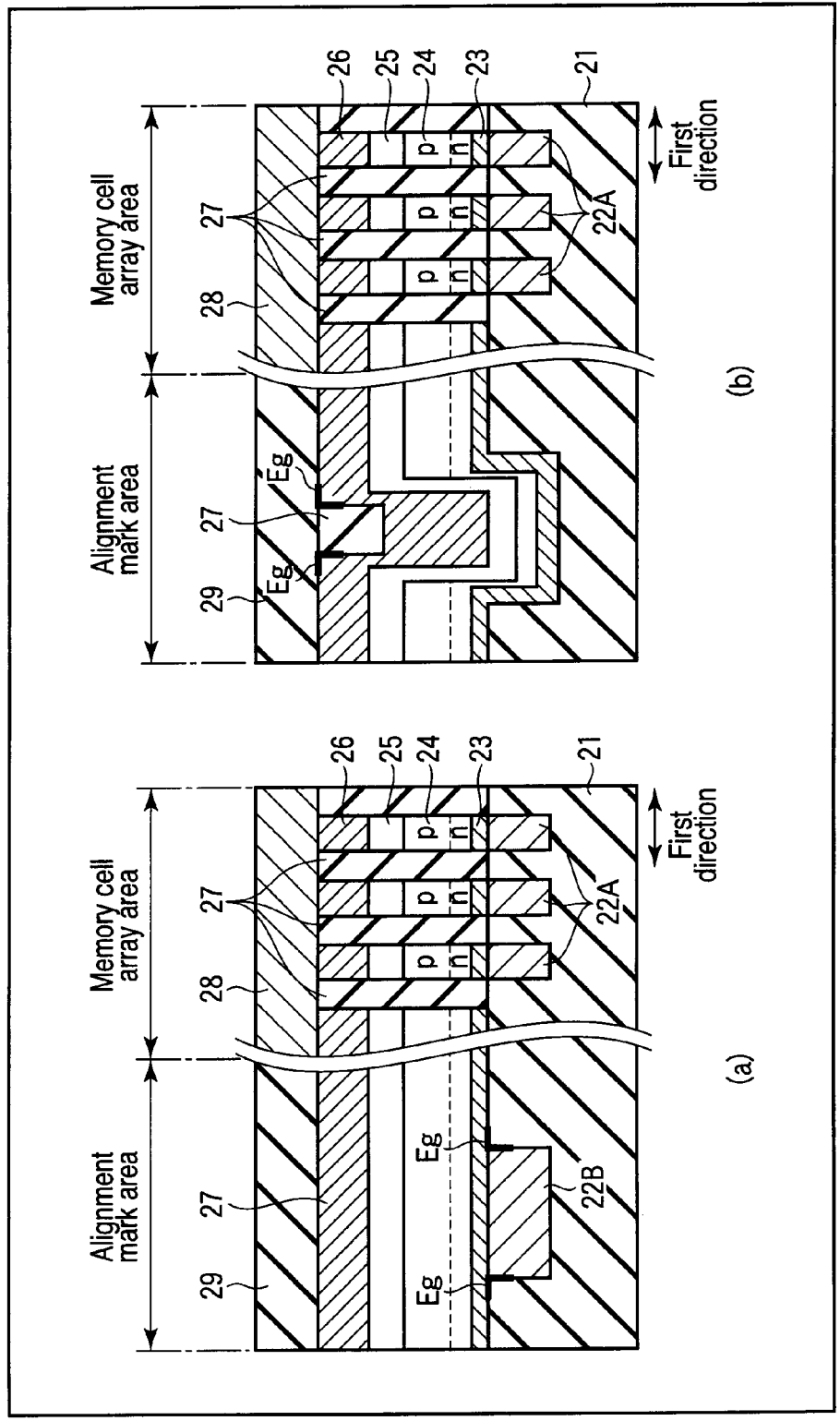

Next, as shown in FIG. 22, conductive layer (e.g., tungsten) 28 is formed on electrode layer 26 and insulating layers 27, 29 by sputtering.

Further, conductive layer 28 is polished by CMP, and remains conductive layer 28 in the grooves formed in insulating layer 29. Because of this, conductive layer 28 in the memory cell array area becomes the conductive lines (word lines/bit lines) having the damascene structure.

Here, even if conductive layer 28 is configured of the opaque material (e.g., tungsten), since conductive layer 28 above alignment mark 22B is removed by CMP, it does not affect the alignment hereafter.

The device structure of FIG. 3 is completed by the aforementioned steps.

Here, this manufacturing method is an example of forming one memory cell array layer. In forming memory cell array layers that are stacked three-dimensionally, the aforementioned manufacturing method may be repeated.

Further, in forming memory cell array layers, as shown in FIG. 23, in the embodiment ((a) in the figure), alignment mark 22B can be omitted for the second and subsequent memory cell array layers except for the lowermost layer.

In contrast, conventionally ((b) in the figure), the alignment mark is necessary for all of the memory cell array layers.

According to the manufacturing method of the second example, similar to the first example, the device structure of FIG. 3 can be obtained easily, and in the manufacturing process, it can be understood that the number of PEP is made less. In addition, the alignment can be performed more accurately than it had conventionally been.

That is, in identifying the alignment mark by the level difference in the topmost layer, when the number of stacked layers on the alignment mark becomes large, the level difference becomes obscure as the natural consequence. Further, increasing this level difference is limited because of the thickness of the insulating layer, etc.

In contrast, in the embodiment, the aforementioned problem does not occur at all, and the edge of the alignment mark does not become obscure.

C. Third Example

A third example is characteristic in that conductive lines 22A and alignment mark 22B are configured of transparent materials.

The third example has conductive lines 22A in the aforementioned first and second examples as $Zn_{0.98}Al_{0.02}O$. As for other parts, it is identical to the first and second examples. Accordingly, the manufacturing processes of FIG. 6 to FIG. 17 or the manufacturing processes of FIG. 18 to FIG. 23 are applied to the third example without any modification.

Since the resistivity of $Zn_{0.98}Al_{0.02}O$ is $2\times10^{-4}$ $\Omega\cdot$cm, the thickness of conductive lines 22A (depth of the grooves) is preferably 2 μm. The permeability of visible light of this material is 85%.

Compared to conductive lines 22A in the first and second examples being the opaque materials, in the third example, conductive lines 22A are of the transparent material. In the third example, since conductive lines 22A is of the transparent material, alignment mark 22B is also of a transparent material.

Here, in the third example, a concern as to whether a boundary between insulating layer (e.g., silicon oxide) 21 and the alignment mark ($Zn_{0.98}Al_{0.02}O$) can be identified arises, however, because of the difference in the materials (difference in their light permeability), it is possible to recognize their boundary by the brightness.

According to a manufacturing method of the third example, conductive lines 22A and alignment mark 22B are configured of the transparent materials. This means that a step of depositing the opaque material (e.g., tungsten) used in a clean room can be omitted.

Note that, since the resistivity of $Zn_{0.98}Al_{0.02}O$ is higher than the resistivity of tungsten, so, upon adapting the third example, whether to employ the third example or not is determined by taking a merit in handling caused by the use of the transparent materials and a demerit that the conductive lines become thicker because of their use into consideration.

(3) Others

In the aforementioned embodiment, examples in which the embodiment is adapted to a cross-point resistance-change memory had been explained. However, the embodiment is adaptable to other information recording/reproducing devices. That is, the embodiment can be adapted to any information recording/reproducing device comprising a structure in which a storage layer and an electrode layer are stacked on an insulating layer in which an alignment mark has been formed.

5. CONCLUSION

According to the embodiment, the manufacturing cost of the information recording/reproducing device can be lowered by the new alignment technique.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An information recording/reproducing device comprising:

a memory cell array area and an alignment mark area, the memory cell array area comprising: an insulating layer on a semiconductor substrate; a first interconnect layer filled in a first groove of the insulating layer; a first stacked layer structure on the first interconnect layer, the first stacked layer structure including a storage layer and an electrode layer; and a second interconnect layer on the first stacked layer structure;

the alignment mark area comprising: the insulating layer; a conductive layer as an alignment mark filled in a second groove of the insulating layer; and a second stacked layer structure on the insulating layer, the second stacked layer structure surrounding the conductive layer and including the storage layer and the electrode layer;

wherein all of the layers in the first and second stacked layer structures comprise a material with a permeability of visible light of 1% or more.

2. The device of claim 1, further comprising:
a third stacked layer structure between the first stacked layer structure and the second interconnect layer, the third stacked layer structure including the storage layer and the electrode layer.

3. The device of claim 2, wherein the third stacked layer structure comprises an insulating layer that does not have an alignment mark.

4. The device of claim 2, wherein the third stacked layer structure comprises an insulating layer that has an alignment mark.

5. The device of claim 1, wherein the memory cell array area comprises a cross-point memory cell array.

6. The device of claim 1, wherein the storage layer comprises a material selected from groups of:

$$L1_x M1_y X_4 \ (0.1 \leq x \leq 2.2, 1.8 \leq y \leq 2), \quad (i)$$

$$L1_x M1_y X_3 \ (0.5 \leq x \leq 1.1, 0.9 \leq y \leq 1), \quad (ii)$$

$$L2_x M2_y X_4 \ (0.5 \leq x \leq 1.1, 0.9 \leq y \leq 1), \quad (iii)$$

$$M3_x O_y \ (0.5 \leq x \leq 1.1, 0.9 \leq y \leq 1), \quad (iv)$$

where L1 is at least one element selected from the group of Na, K, Rb, Be, Mg, Ca, Sr, Ba, Al, Ga, Mn, Fe, Co, Ni, Cu, Zn, Ge, Ag, Au, Cd, Sn, Sb, Pt, Pd, Hg, Tl, Pb and Bi, M1 is at least one element selected from the group of Al, Ga, Ti, Ge, Sn, V, Cr, Mn, Fe, Co, Ni, Nb, Ta, Mo, W, Ru and Rh, L2 is at least one element selected from the group of Mg, Ca, Sr, Al, Ga, Sb, Ti, V, Cr, Mn, Fe, Co, Rh, In, Sb, Tl, Pb and Bi, M2 is at least one element selected from the group of Al, Ga, Ti, Ge, Sn, V, Nb, Ta, Cr, Mn, Mo, W, Ir and Os, and M3 is at least one element selected from the group of Al and transition metal elements;

in regard to (i) and (ii), L1 and M1 are elements that are different from one another, and in regard to (iii), L2 and M2 are elements that are different from one another; and X is at least one element selected from the group of O and N.

7. The device of claim 1, wherein the electrode layer comprises a material selected from groups of:

$$A1_{1-x} B1_x O_y \quad (i)$$

where A1 is at least one element selected from the group of Sn and Pb, B1 is at least one element selected from the group of P, As, Sb and Bi, O is elemental oxygen, and $0.01 \leq x \leq 0.15$, $1.5 \leq y \leq 2.8$;

$$A1_{1-x} B2_x O_y \quad (ii)$$

where A1 is at least one element selected from the group of Sn and Pb, B2 is at least one element selected from the group of F, Cl and Br, O is elemental oxygen, and $0.05 \leq x \leq 0.60$, $1.5 \leq y \leq 2.8$;

$$A3_{1-x} B3_x O_y \quad (iii)$$

where A3 is at least one element selected from the group of Zn and Cd, B3 is at least one element selected from the group of Al, Ga, B and In, O is elemental oxygen, and $0.01 x \leq 0.20$, $1.5 \leq y \leq 2.8$;

$$Ti_{1-x} B4_x O_y \quad (iv)$$

where Ti is elemental titanium, B4 is at least one element selected from the group of V, Nb, Ta, Cr, Mo and W, O is elemental oxygen, and $0.01 \leq x \leq 0.20$, $1.5 \leq y \leq 2.8$; and $$In_{1-x} B5_x O_y \quad (v)$$

where In is elemental indium, B5 is at least one element selected from the group of Zn, Cd, Ge and Sn, O is elemental oxygen, and $0.01 \leq x \leq 0.20$, $1.5 \leq y \leq 2.8$.

8. The device of claim 1, wherein a thickness of the electrode layer is 250 nm or more and 5 .mu.m or less.

9. The device of claim 1, wherein the permeability of the insulating layer and the conductive layer are different from each other.

10. The device of claim 1, wherein the first interconnect layer functions as a first conductive line extending in a first direction, and the first interconnect layer and the conductive layer comprise an identical material.

11. The device of claim 10, wherein the electrode layer in the first stacked layer structure is an uppermost layer in the first stacked layer structure, and the electrode layer in the first stacked layer structure is connected to the second interconnect layer which functions as a second conductive line extending in a second direction that intersects with the first direction.

12. The device of claim 11, wherein the second conductive line is not arranged above the alignment mark.

13. The device of claim 1, wherein the first stacked layer structure further comprises a diode.

14. The device of claim 1, further comprising:
a silicon oxide layer above the alignment mark.

15. The device of claim 1, wherein the second stacked layer structure comprises the storage layer and the electrode layer above the alignment mark.

16. The device of claim 1, wherein the first and second stacked layer structures comprise a barrier metal layer and a polysilicon layer.

* * * * *